(12) United States Patent
Hiroyama et al.

(10) Patent No.: US 8,193,016 B2
(45) Date of Patent: Jun. 5, 2012

(54) SEMICONDUCTOR LASER DEVICE AND METHOD OF MANUFACTURING THE SAME

(75) Inventors: Ryoji Hiroyama, Kyo-tanabe (JP); Daijiro Inoue, Kyoto (JP); Yasuyuki Bessho, Uji (JP); Masayuki Hata, Kadoma (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 12/985,632

(22) Filed: Jan. 6, 2011

(65) Prior Publication Data

US 2011/0104839 A1    May 5, 2011

Related U.S. Application Data

(62) Division of application No. 12/357,282, filed on Jan. 21, 2009, now Pat. No. 7,903,709.

(30) Foreign Application Priority Data

Jan. 21, 2008 (JP) .................................. 2008-10202
Jan. 15, 2009 (JP) .................................... 2009-6780

(51) Int. Cl.
*H01L 21/00* (2006.01)

(52) U.S. Cl. ........... 438/31; 257/E21.085; 257/E21.097; 257/E21.108; 257/E21.117; 257/E21.172; 257/E21.238; 257/E21.286; 257/E21.365; 257/E21.393; 372/43.01; 372/46.01; 438/460; 438/462

(58) Field of Classification Search ........... 257/E21.085, 257/E21.097, E21.108, E21.117, E21.172, 257/E21.286, E21.365, E21.393; 372/43.01, 46.01; 438/31, 460, 462
See application file for complete search history.

(56) References Cited

U.S. PATENT DOCUMENTS

| 6,737,678 B2 | 5/2004 | Kawakami et al. |
| 7,041,523 B2 | 5/2006 | Kawakami et al. |
| 2007/0170442 A1* | 7/2007 | Hata et al. ........................ 257/79 |

FOREIGN PATENT DOCUMENTS

| JP | 4-262589 A | 9/1992 |
| JP | 2003-17791 A | 1/2003 |
| JP | 2006-287137 A | 10/2006 |

* cited by examiner

*Primary Examiner* — Asok Sarkar
(74) *Attorney, Agent, or Firm* — Ditthavong Mori & Steiner, P.C.

(57) ABSTRACT

A semiconductor laser device includes a substrate and a semiconductor layer formed on a surface of the substrate and having a waveguide extending in a first direction parallel to the surface, wherein the waveguide is formed on a region approaching a first side from a center of the semiconductor laser device in a second direction parallel to the surface and intersecting with the first direction, a first region separated from the waveguide on a side opposite to the first side of the waveguide and extending parallel to the first direction and a first recess portion separated from the waveguide on an extension of a facet of the waveguide, intersecting with the first region and extending in the second direction are formed on an upper surface of the semiconductor laser device, and a thickness of the semiconductor layer on the first region is smaller than a thickness of the semiconductor layer on a region other than the first region.

13 Claims, 15 Drawing Sheets

FACET COATING FILM    FACET COATING FILM

SEMICONDUCTOR LASER DEVICE AND METHOD OF MANUFACTURING THE SAME

CROSS-REFERENCE TO RELATED APPLICATIONS

This application is a Divisional Application of U.S. application Ser. No. 12/357,282 filed on Jan. 21, 2009.

The priority application number JP2008-10202, Semiconductor Laser Device and Method of Manufacturing the Same, Jan. 21, 2008, Ryoji Hiroyama et al, JP2009-6780, Semiconductor Laser Device and Method of Manufacturing the Same, Jan. 15, 2009, Ryoji Hiroyama et al, upon which this patent application is based is hereby incorporated by reference.

BACKGROUND OF THE INVENTION

1. Field of the Invention

The present invention relates to a semiconductor laser device and a method of manufacturing the same, and more particularly, it relates to a semiconductor laser device comprising a semiconductor layer provided with a waveguide and a method of manufacturing the same.

2. Description of the Background Art

A nitride-based semiconductor laser device comprising a semiconductor layer provided with a striped waveguide is known in general, as disclosed in Japanese Patent Laying-Open No. 2003-17791, for example.

Referring to FIG. 29, a semiconductor layer 102 having a ridge portion 102a constituting a striped waveguide is formed on a GaN-based substrate 101 in the conventional nitride-based semiconductor laser device 1000 disclosed in the aforementioned Japanese Patent Laying-Open No. 2003-17791. This ridge portion 102a is provided at the center of the nitride-based semiconductor laser device in a cross direction (direction P). A p-side electrode 103 is provided on the semiconductor layer 102. An n-side electrode 104 in ohmic contact with the GaN-based substrate 101 is provided on a back surface of the GaN-based substrate 101. Two mirror facets 105 and 106 consisting of cleavage planes are formed to be orthogonal to the ridge portion 102a. These two mirror facets 105 and 106 constitute cavity facets.

Grooving portions 107 for cleavage introduction are formed on the GaN-based substrate 101, the semiconductor layer 102 and the p-side electrode 103. These grooving portions 107 are formed on the two mirror facets 105 and 106 consisting of the cleavage planes along a direction orthogonal to the ridge portion 102a at the same distance in the direction P leftwardly and rightwardly from the ridge portion 102a, to hold the ridge portion 102a provided at the center therebetween. In other words, the grooving portions 107 are horizontally symmetrically formed with respect to the ridge portion 102a.

In this nitride-based semiconductor laser device, a metal wire 108 for supplying power to the p-side electrode 103 is wire-bonded to the p-side electrode 103.

In general, the metal wire 108 is usually wire-bonded to the center of the p-side electrode 103. Particularly when the length in the cross direction (direction P) is reduced due to downsizing of the nitride-based semiconductor laser device, the bonding position must be matched with the center, in order to increase allowance (margin) with respect to displacement in wire bonding.

In the structure of the nitride-based semiconductor laser device disclosed in the aforementioned Japanese Patent Laying-Open No. 2003-17791, however, the ridge portion 102a is formed at the center of the nitride-based semiconductor laser device, and hence the metal wire 108 is bonded to a portion immediately above the ridge portion 102a provided at the center when the metal wire 108 is bonded to the p-side electrode 103, if the length of the nitride-based semiconductor laser device in the cross direction (direction P) is reduced. Therefore, the ridge portion 102a (waveguide) is disadvantageously damaged in bonding of the metal wire 108 to deteriorate laser characteristics.

In the nitride-based semiconductor laser device, tensile stress is usually caused in an extensional direction of the waveguide and a direction orthogonal to this direction due to difference in lattice constants between a GaN layer and an AlGaN layer in forming the semiconductor layer. In the structure of the nitride-based semiconductor laser device disclosed in the aforementioned Japanese Patent Laying-Open No. 2003-17791, therefore, microcracks voluntarily caused between the grooving portions 107 in the form of broken lines formed on the semiconductor layer 102 may be formed in the cross direction (direction P in FIG. 29) of the semiconductor laser device while causing steps in the extensional direction of the waveguide (direction Q in FIG. 29) in the vicinity of the ridge portion 102a, when the wafer is cleaved in the form of a bar. In this case, the semiconductor layer 102 is cleaved starting from the microcracks having steps in the extensional direction (direction Q) of the waveguide, and hence the smooth cleavage planes (mirror facets 105 and 106) can not be obtained, and cleavage can not be excellently performed. Therefore, the ridge portion 102a (waveguide) is disadvantageously damaged.

SUMMARY OF THE INVENTION

A semiconductor laser device according to a first aspect of the present invention comprises a substrate and a semiconductor layer formed on a surface of the substrate and having a waveguide extending in a first direction parallel to the surface, wherein the waveguide is formed on a region approaching a first side from a center of the semiconductor laser device in a second direction parallel to the surface and intersecting with the first direction, a first region separated from the waveguide on a side opposite to the first side of the waveguide and extending parallel to the first direction and a first recess portion separated from the waveguide on an extension of a facet of the waveguide, intersecting with the first region and extending in the second direction are formed on an upper surface of the semiconductor laser device, and a thickness of the semiconductor layer on the first region is smaller than a thickness of the semiconductor layer on a region other than the first region.

In other words, the semiconductor laser device according to the first aspect of the present invention comprises the substrate and the semiconductor layer formed on the surface of the substrate and formed with the waveguide extending in a prescribed direction, wherein the waveguide is formed on the region approaching the first side from the center of the semiconductor layer, and the first concave region is so formed from the side of the semiconductor layer on the region of the side opposite to the first side of the waveguide at a prescribed distance as to extend parallel to a prescribed extensional direction of the waveguide, and the first recess portion is so formed on the extension of the facet of the waveguide at a prescribed distance from the waveguide from the side of the semiconductor layer as to intersect with the first concave region and to extend in a direction intersecting with the prescribed extensional direction of the waveguide.

In the semiconductor laser device according to the first aspect, as hereinabove described, the waveguide extending in the prescribed direction (first direction parallel to the surface of the substrate) is formed on the region approaching the first side from the center of the semiconductor layer in the second direction parallel to the surface of the substrate and intersecting with the first direction. Thus, bonding of a metal wire onto the waveguide can be suppressed in a case of bonding the metal wire to the center of an upper surface of the semiconductor layer for supplying power to the upper surface of the semiconductor layer, whereby damage of the waveguide can be suppressed in bonding. Consequently, deterioration of the laser characteristics can be suppressed.

In this semiconductor laser device, the first region is so formed on the upper surface of the semiconductor laser device as to extend parallel to the extensional first direction of the waveguide, and the thickness of the semiconductor layer on the first region is smaller than the thickness of the semiconductor layer on the region other than the first region. Thus, the semiconductor layer is divided in the second direction (cross direction of the semiconductor laser device) intersecting with the extensional direction of the first region with respect to the first region employed as a center, and hence tensile stress caused in the second direction (cross direction of the semiconductor laser device) can be rendered smaller than tensile stress caused in the extensional direction of the waveguide due to difference in the lattice constants between the substrate and the semiconductor layer in forming the semiconductor layer. Consequently, microcracks voluntarily caused between the first regions are inhibited from formation while causing steps in the extensional direction of the waveguide. Thus, the cleavage is excellently performed along a plurality of the first recess portions and the smooth cleavage planes (cavity facets) are obtained, and hence damage of the waveguide can be suppressed.

In this semiconductor laser device, the first recess portion is so formed on the extension of the facet of the waveguide at the prescribed distance from the waveguide from the side of the semiconductor layer as to intersect with the first region and to extend in the second direction intersecting with the extensional first direction of the waveguide. In other words, the first recess portion is formed on the region on the extension of the facet of the waveguide at the distance from the waveguide. Thus, the first recess portion can be formed on the position separated from the waveguide, and hence damage of the waveguide can be suppressed when the first recess portion is formed from the side of the semiconductor layer. Thus, deterioration of the laser characteristics of the devices can be suppressed also by this.

A method of manufacturing a semiconductor laser device according to a second aspect of the present invention comprises steps of forming a semiconductor layer including a plurality of waveguides extending in a first direction parallel to the surface and first regions separated from the waveguides and extending parallel to the plurality of waveguides on a surface of a substrate, forming a plurality of first recess portions intersecting with the first regions and extending in a second direction parallel to the surface and intersecting with the first direction on regions separated from the waveguides from a side of an upper surface of the semiconductor layer, performing cleavage along the plurality of first recess portions, and forming chips by separating the semiconductor layer along the first direction, wherein a thickness of the semiconductor layer on the first region is smaller than a thickness of the semiconductor layer on a region other than the first region, and each of the chips has the waveguide on a region approaching a first side from a center of the chip in the second direction.

In other words, the method of manufacturing a semiconductor laser device according to the second aspect of the present invention comprises steps of forming a semiconductor layer including a plurality of the waveguides extending in a prescribed direction and the first concave regions extending parallel to the plurality of waveguides on the surface of the substrate, forming a plurality of the first recess portions for cleavage introduction between the plurality of waveguides from the side of the semiconductor layer so as to intersect with the first concave regions and to extend in a direction intersecting with the prescribed extensional direction of the waveguides, performing cleavage along the plurality of first recess portions and performing separation along the prescribed extensional direction of the waveguides so that each semiconductor laser device has the waveguide on the region approaching the first side from the center of the semiconductor layer.

As hereinabove described, the method of manufacturing the semiconductor laser device according to the second aspect comprises a step of performing separation so that each semiconductor laser device has the waveguide on the region approaching the first side in the cross direction from the center of the semiconductor layer. In other words, each of the chips formed by performing the separation step has the waveguide on the region approaching the first side from the center of the chip in the second direction. Thus, bonding of a metal wire onto the waveguide can be suppressed in a case of bonding the metal wire to the center of the side of an upper surface of the semiconductor layer for supplying power to the upper surface of the semiconductor layer, whereby damage of the waveguide can be suppressed in bonding. Consequently, deterioration of the laser characteristics can be suppressed.

The method of manufacturing the semiconductor device comprises a step of forming the semiconductor layer including the first regions extending parallel to a plurality of the waveguides, and the thickness of the semiconductor layer on the first region is rendered smaller than the thickness of the semiconductor layer on the region other than the first region. Thus, the semiconductor layer is divided by the first regions in the second direction (cross direction of the semiconductor laser device) intersecting with the extensional direction of the first regions with respect to the first regions employed as centers, and hence tensile stress caused in the second direction (cross direction of the semiconductor laser device) can be rendered smaller than tensile stress caused in the extensional direction of the waveguides due to difference in the lattice constants between the substrate and the semiconductor layer in forming the semiconductor layer. Consequently, microcracks voluntarily caused between the first recess portions are inhibited from formation while causing steps in the extensional direction of the waveguide at the time of the cleavage, whereby the cleavage is excellently performed and the smooth cleavage planes (side surfaces including the facets of the waveguide forming the cavity facets) are obtained. Thus, damage of the waveguide can be suppressed.

In the manufacturing process of the semiconductor laser device, the first regions can inhibit nonuniformity of the crystal growth layer (local change of the thickness of the semiconductor layer) from influencing the vicinity of the regions formed with the waveguides when the first regions are formed on the positions separated by the prescribed distances from the waveguides by stacking the semiconductor layer on the substrate, and hence deterioration of the laser characteristics of the devices can be further suppressed.

The method of manufacturing a semiconductor laser device comprises a step of forming the plurality of first recess portions between the plurality of waveguides from the side of the semiconductor layer so as to intersect with the first regions and to extend in the second direction intersecting with the extensional first direction of the waveguides. In other words, the method of manufacturing a semiconductor laser device comprises a step of forming the plurality of first recess portions intersecting with the first regions and extending in the second direction parallel to the surface and intersecting with the first direction from the side of the upper surface of the semiconductor layer. Thus, the first recess portions can be formed on the positions separated from the waveguides and hence damage of the waveguides can be suppressed when the first recess portions are formed from the side of the upper surface of the semiconductor layer. Thus, deterioration of the laser characteristics of the device can be suppressed also by this.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 2:
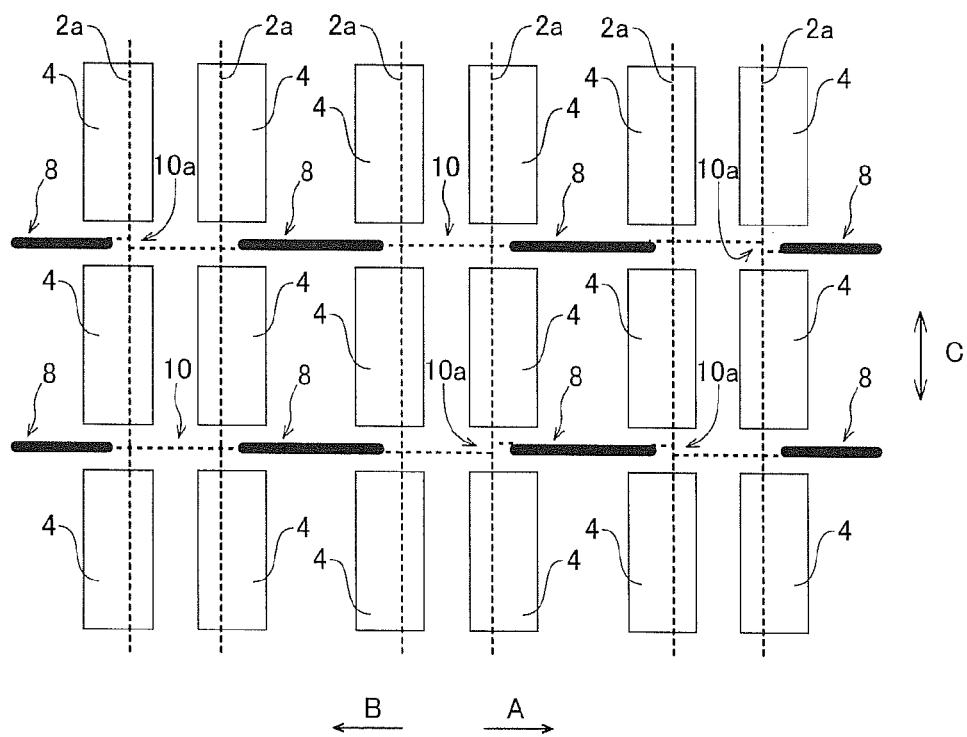
FIG. 2 is a plan view for illustrating the concept of the present invention.
Figure 3:
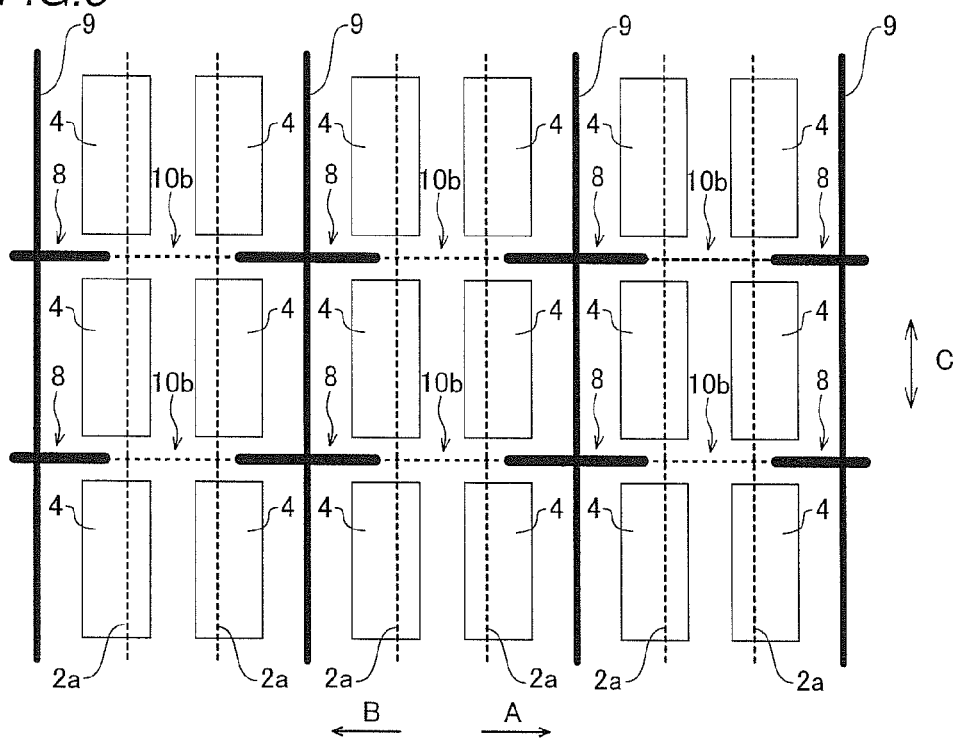
FIG. 3 is another plan view for illustrating the concept of the present invention.

The concept of the present invention will be now described with reference to FIGS. 1 to 3, before describing specific embodiments of the present invention.

Figure 1:
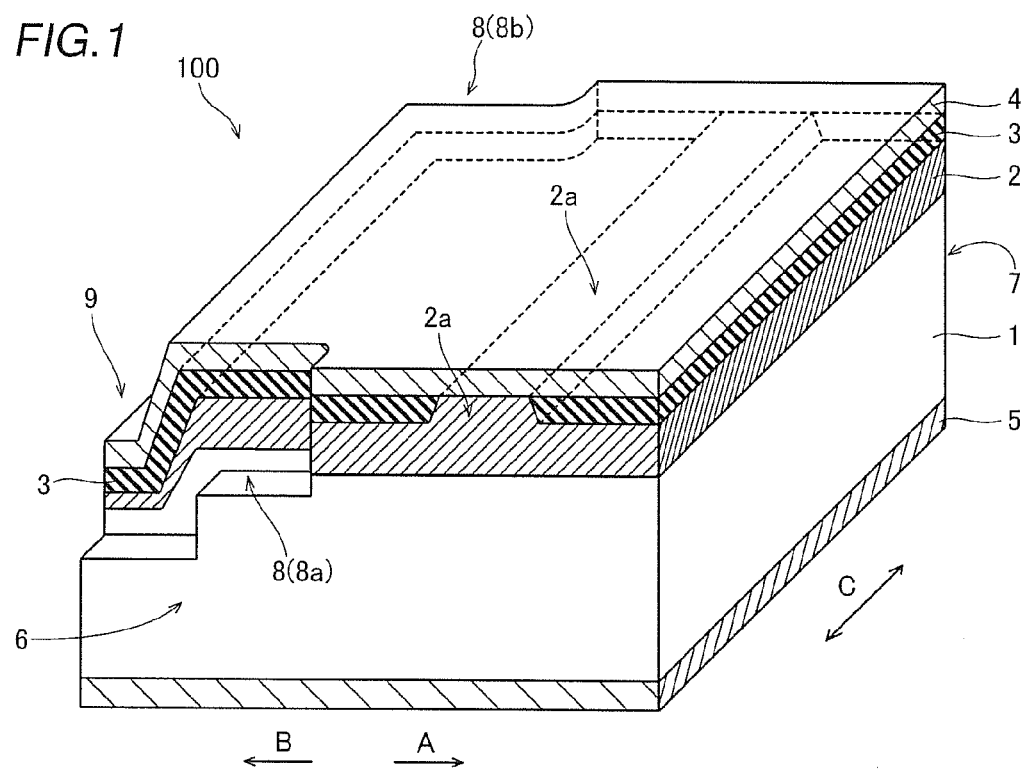
FIG. 1 is a perspective view for illustrating the concept of the present invention.

In a semiconductor laser device 100 according to an embodiment of the present invention, a semiconductor layer 2 having a current injection region 2a constituting a waveguide extending in a prescribed direction (direction C: laser emission direction of the semiconductor laser device 100) is formed on a substrate 1 in a region approaching a first side (side along arrow A) in the cross direction (along arrow A and along arrow B) of the semiconductor laser device 100 from the center of the substrate 1, as shown in FIG. 1. The direction C which is the laser emission direction of the semiconductor laser device 100 and the direction along arrow A (direction along arrow B) which is the cross direction of the semiconductor laser device 100 are examples of the "first direction" or the "second direction" in the present invention respectively. The current injection region 2a is an example of the "waveguide" in the present invention. A current blocking layer 3 is formed on the semiconductor layer 2 except an upper surface of the current injection region 2a. A first electrode 4 in ohmic contact with the current injection region 2a of the semiconductor layer 2 is provided on the current blocking layer 3. A second electrode 5 in ohmic contact with the substrate 1 is provided on a back surface of the substrate 1. Two cleavage planes 6 and 7 are formed to be orthogonal to the current injection region 2a (waveguide).

Cleavage introduction steps 8a and 8b for performing cleavage are formed on the semiconductor layer 2, the current blocking layer 3 and the first electrode 4. These cleavage introduction steps 8a and 8b are formed only on a region opposite (on a side along arrow B) to the first side (side along arrow A) of the current injection region 2a on the cleavage planes 6 and 7 which are extensions of facets of the current injection region at a prescribed interval from the current injection region 2a (waveguide), to extend in a direction (along arrow A (along arrow B)) orthogonal to the current injection region 2a (waveguide). In the semiconductor layer 2, a groove portion 9 is so formed from the side of the upper surface of the semiconductor layer 2 toward the substrate 1 on the region of the upper surface of the semiconductor laser device 100 on a side opposite (on the side along arrow B) to the first side (side along arrow A) of the current injection region 2a as to extend in a direction (direction C) parallel to the current injection region 2a. The groove portion 9 is so formed as to intersect with the cleavage introduction steps 8a and 8b. The first electrode 4 and the second electrode 5 are examples of the "first electrode layer" and the "second electrode layer" in the present invention respectively. The cleavage introduction steps 8a and 8b are examples of the "first recess portion" in the present invention and the groove portion 9 is an example of the "first region" in the present invention. The groove portions 9 are preferably formed so as not to protrude from ends of the cleavage introduction steps 8a and 8b in a longitudinal direction (along arrow A) to the current injection regions 2a. Thus, the groove portions 9 and the cleavage introduction steps 8 are arranged so that microcracks 10b can be easily formed between the cleavage introduction steps 8 adjacent to each other along arrow A (along arrow B) in FIG. 3 described later.

In this semiconductor laser device 100, as hereinabove described, the current injection region 2a constituting the waveguide extending in the laser emission direction (direction C) parallel to the surface of the substrate 1 is formed on the region approaching the first side (side along arrow A) in the cross direction (along arrow A (along arrow B)), parallel to the surface of the substrate 1 and intersecting with the direction C, of the semiconductor laser device 100 from the center of the semiconductor layer 2. Thus, bonding of a metal wire onto the waveguide can be suppressed in a case of bonding the metal wire to the center of the upper surface of the semiconductor layer 2 for supplying power to the upper surface of the semiconductor layer 2, whereby damage of the waveguide can be suppressed in bonding. Consequently, deterioration of the laser characteristics can be suppressed.

The substrate 1 consists of a semiconductor having a hexagonal structure containing a nitride, and may consist of GaN, AlN, InN, BN, TlN or alloyed semiconductors of these. The substrate 1 may have n-type conductivity, or may have p-type conductivity. In relation to the plane orientation of the substrate 1, a substrate of a {0001} plane, a {11-22} plane, a {11-20} plane or a {1-100} plane can be employed. In this case, the cleavage planes 6 and 7 are preferably formed by the {1-100} plane or the {0001} plane, in view of planarity of the cleavage planes 6 and 7 and easiness in cleavage.

The semiconductor layer 2 includes at least a layer of a conductivity type different from that of the substrate 1. This semiconductor layer 2 may include an active layer. In this case, the semiconductor layer 2 may have the layer of the conductivity type different from that of the substrate 1 on the surface of the active layer opposite to the substrate 1. Further, the active layer may be held between two layers of conductivity types different from each other, having larger band gaps than the active layer. In this case, one of the two layers of conductivity types different from each other may be the substrate 1.

At least one layer in the semiconductor layer 2 has a lattice constant smaller than the substrate. In this case, tensile stress is applied on the semiconductor layer 2 in directions (along arrow A, along arrow B and in the direction C) parallel to the surface of the semiconductor layer 2, as shown in FIG. 2. The cleavage introduction steps 8 are formed in the form of broken lines in the direction (along arrow A (along arrow B)) orthogonal to the extensional direction of the waveguide in a manufacturing process in a state where the tensile stress in the extensional direction (direction C) of the waveguide exists, thereby causing microcracks 10 (shown by broken lines in FIG. 2) between the cleavage introduction steps 8 adjacent to each other. Then, cleavage is performed along the cleavage introduction steps 8 and hence the cleavage is excellent as compared with a case where no cleavage introduction step 8 is formed. In this state, however, the tensile stress having substantially the same strength as the tensile stress applied in the extensional direction C of the waveguide is caused also in the direction (along arrow A (along arrow B)) orthogonal to the extensional direction of the waveguide, and hence microcracks 10a (shown by broken lines) extend while locally causing steps in the extensional direction C of the waveguide as shown in FIG. 2. In this case, the smooth cleavage planes may not be formed on the semiconductor layer 2.

In this semiconductor laser device 100, the groove portions 9 (shown by thick lines in FIG. 2) are formed to extend parallel to the extensional direction (direction C) of the current injection region 2a on the surface of the semiconductor layer 2, so that the thickness of the semiconductor layer 2 on the groove portion 9 is smaller than the thickness of the semiconductor layer 2 on the region other than the groove portion 9. In other words, the groove portion 9 divides the semiconductor layer 2 (see FIG. 1) in the direction along arrow A (along arrow B) which is orthogonal to the extensional direction of the waveguide, as shown in FIG. 3. Thus, the tensile stress along arrow A (along arrow B) is reduced as compared with the tensile stress in the direction C and hence formation of the microcracks 10a having steps as shown in FIG. 2 is eliminated. As shown in FIG. 3, linear microcracks 10b (shown by broken lines in FIG. 2) are formed along arrow A (along arrow B) starting from the cleavage introduction steps 8 adjacent to each other. Consequently, the semiconductor layer 2 (see FIG. 1) is cleaved starting from the linear microcracks 10b, and hence cleavage of the semiconductor layer 2 is more excellently performed and the smooth cleavage planes 6 and 7 are obtained. Thus, damage of the waveguide can be suppressed.

In this semiconductor laser device 100, the cleavage introduction steps 8a and 8b are so formed on the extensions of the cleavage planes 6 and 7 formed as facets of the waveguide at a prescribed interval from the current injection region 2a constituting the waveguide from the side of the semiconductor layer 2 as to intersect with the groove portion 9 and to extend in a direction intersecting with a prescribed extensional direction of the waveguide. In other words, the cleavage introduction steps 8a and 8b are formed on the regions on the extensions of the cleavage planes 6 and 7 at a distance from the waveguide. Thus, the cleavage introduction steps 8a and 8b can be formed on positions separated from the waveguide, and hence damage of the waveguide can be suppressed when the cleavage introduction steps 8a and 8b are formed from the side of the upper surface of the semiconductor layer 2. Thus, deterioration of the laser characteristics can be suppressed also by this.

The current injection region 2a may be formed by a ridge portion having a convex sectional shape as shown in FIG. 1, or an opening (not shown) extending in the direction C may be provided on the current blocking layer 3 without providing the convex ridge portion, for connecting the current injection region 2a defined by the opening and the first electrode 4 with each other through the opening.

The current injection region 2a is preferably formed along the <1-100> direction (direction C) orthogonal to the {1-100} plane which is the plane orientation capable of obtaining an excellent cleavage plane.

The semiconductor layer 2 consists of a semiconductor having a hexagonal structure containing a nitride, and may consist of GaN, AlN, InN, BN, TlN or alloyed semiconductors of these. The band gaps of the respective layers (the layer of the conductivity type different from that of the substrate 1, the active layer, the two layers of conductivity types different from each other etc.) constituting the semiconductor layer 2 can be set to desired values by varying the ratios of the materials and the alloyed semiconductors constituting the layers.

Carbon, oxygen, silicon, sulfur, germanium, selenium or tellurium can be employed as a dopant introduced into an n-type substrate 1 and n-type layers of the semiconductor layer 2, while beryllium, magnesium or zinc can be employed as a dopant introduced into a p-type substrate 1 and p-type layers of the semiconductor layer 2.

The current blocking layer 3 is employed for blocking current injection into the regions other than the current injection region 2a, and can be formed by an insulator or a high-resistance material. More specifically, an oxide or a nitride of aluminum, silicon, titanium, zinc, gallium, zirconium, indium or hafnium can be employed.

The first electrode 4 and the second electrode 5 are ohmic electrodes for supplying power to the current injection region 2a and the substrate 1 respectively, and both are made of materials having conductivity. The first electrode 4 and the second electrode 5 may be constituted of aluminum, silicon, titanium, chromium, nickel, germanium, rhodium, palladium, silver, indium, tin, platinum, gold or an alloy thereof, or multilayer structures obtained by stacking layers of these. The first electrode 4 and the second electrode 5 may be formed at prescribed intervals from the cleavage planes 6 and 7. Further, the first electrode 4 and the second electrode 5 may be formed at prescribed intervals from the side surfaces (side surfaces parallel to the waveguide) of the device.

The cleavage introduction steps 8a and 8b are recess portions for normally performing cleavage, and may be formed by scratching with a hard tool such as a diamond point having a sharp forward end, or may be formed by applying a beam such as a laser beam or an ion beam having high energy to only desired regions thereby evaporating the material of these portions.

Embodiments embodying the aforementioned concept of the present invention will be hereinafter described with reference to the drawings.

(First Embodiment)

The structure of a GaN-based semiconductor laser chip (device) 200 according to a first embodiment will be now described with reference to FIGS. 4 and 5. The GaN-based semiconductor laser chip 200 according to the first embodiment is a 400 nm-band semiconductor laser chip (violet laser diode).

Figure 4:
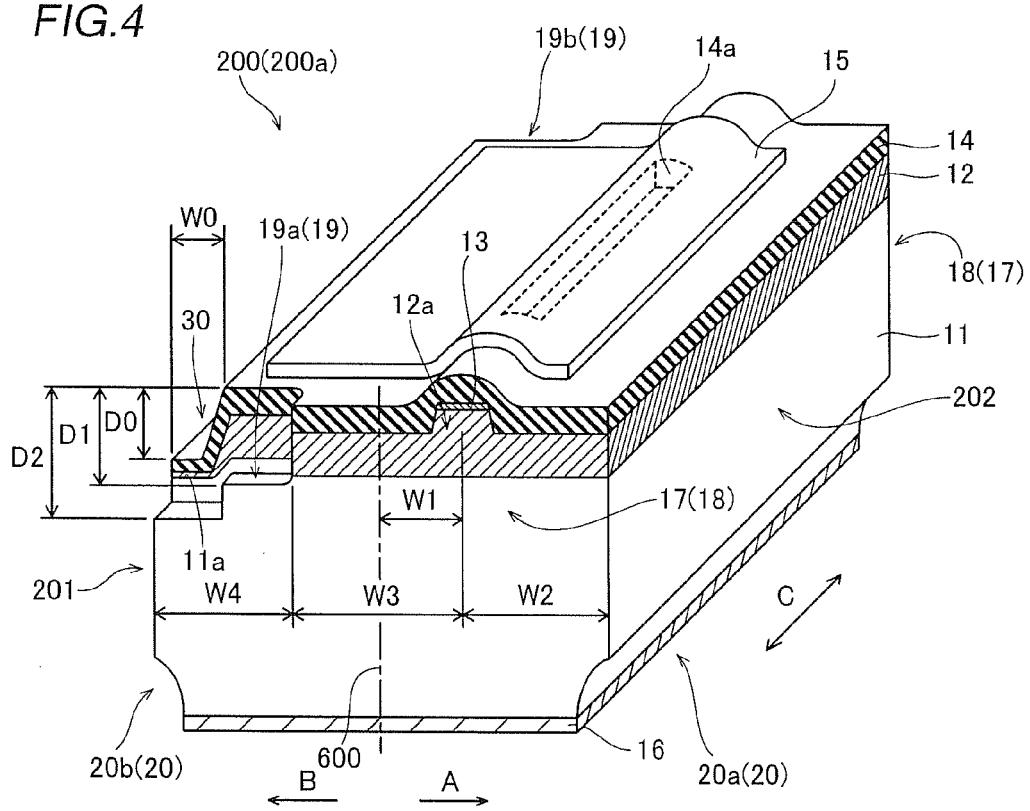
FIG. 4 is a perspective view showing the structure of a GaN-based semiconductor laser chip according to a first embodiment of the present invention.

In the GaN-based semiconductor laser chip 200 according to the first embodiment, a semiconductor layer 12 including an active layer 24 (see FIG. 5) described later and having a p-n junction is formed on a substrate 11 made of n-type GaN, as shown in FIG. 4. This semiconductor layer 12 includes a ridge portion 12a constituting a waveguide extending in a direction C in a striped (slender) manner. The direction C is a laser emission direction of the GaN-based semiconductor laser chip 200 and is an example of the "first direction" in the present invention. The ridge portion 12a is an example of the "waveguide" in the present invention.

The GaN-based semiconductor laser chip 200 has a first device side surface 201 parallel to the extensional direction C of the ridge portion 12a and a second device side surface 202 opposed to the first device side surface 201 and parallel to the direction C, and the second device side surface 202 and the first device side surface 201 are formed on a side along arrow A and a side along arrow B in a direction (along arrow A (along arrow B)) orthogonal to the direction C respectively. The direction along arrow A (direction along arrow B) is the cross direction of the GaN-based semiconductor laser chip 200 and is an example of the "second direction" in the present invention.

According to the first embodiment, a groove portion 30 extending in a direction parallel to the extensional direction (direction C) of the ridge portion 12a is formed on the upper surface of the GaN-based semiconductor laser chip 200 from a side of the semiconductor layer 12 as shown in FIG. 4. The groove portion 30 is so formed as to overlap a groove portion 11a formed on the surface of the substrate 11 in a manufacturing process described later. The groove portion 30 is so formed as to have a width W0 (=about 10 μm) along arrow A from a facet (first device side surface 201) of the GaN-based semiconductor laser chip 200 on the side along arrow B and to have a depth D0 (=about 5 μm) from an upper surface of the GaN-based semiconductor laser chip 200 to the substrate 11. The groove portion 30 is an example of the "first region" in the present invention. FIG. 4 slightly exaggeratingly shows a thickness of the semiconductor layer 12 constituting the groove portion 30. The groove portion 11a formed on the surface of the substrate 11 is an example of the "third recess portion" in the present invention.

As shown in FIG. 4, the GaN-based semiconductor laser chip 200 is so formed that a length (width) along arrow A (along arrow B) is about 200 μm and a length (depth) in the direction C is about 400 μm. A cleavage direction (direction substantially orthogonal to the ridge portion 12a) (along arrow A (along arrow B)) is a <11-20> direction. A plane (cleavage plane 17 or 18 described later) emitting a laser beam is an M plane ({1-100} plane).

According to the first embodiment, the ridge portion 12a is formed on a region approaching a first side (side along arrow A) by a distance W1 (=about 30 μm) from a center 600 (shown by a one-dot chain line in FIG. 4) of the GaN-based semiconductor laser chip 200 along arrow A (along arrow B), and is formed inward by a prescribed distance W2 (=about 70 μm) from an end of the first side (side along arrow A) of the GaN-based semiconductor laser chip 200. A p-side electrode 13 obtained by stacking a Pt film and a Pd film successively from the side of the ridge portion 12a is formed on the upper surface of this ridge portion 12a. A current blocking layer 14 made of an $SiO_2$ film having a thickness of about 300 nm is formed on the semiconductor layer 12, to cover the p-side electrode 13. An opening 14a is provided on a region of this current blocking layer 14 immediately above the p-side electrode 13 other than the vicinity of both ends (cleavage planes 17 and 18 described later) in the direction C. A p-side pad electrode 15 obtained by stacking a Ti film and an Au film successively from the sides of the p-side electrode 13 and the current blocking layer 14 is formed on regions of the p-side electrode 13 and the current blocking layer 14 enclosed with lines inward by about 30 μm from the facets (four surfaces of the first device side surface 201, the second device side surface 202 and the cleavage planes 17 and 18) of the GaN-based semiconductor laser chip 200. The p-side pad electrode 15 is an example of the "first electrode layer" in the present invention. This p-side pad electrode 15 is so formed that the length (width) along arrow A (along arrow B) is about 140 μm and the length (depth) in the direction C is about 340 μm. An n-side electrode 16 obtained by stacking a Ti film, a Pt film and an Au film successively from the side of the substrate 11 is formed on the back surface of the GaN-based semiconductor laser chip 200. The n-side electrode 16 is an example of the "second electrode layer" in the present invention.

In the GaN-based semiconductor laser chip 200, two cleavage planes 17 and 18 are formed to be orthogonal to the ridge portion 12a constituting the waveguide. These two cleavage planes 17 and 18 constitute cavity facets of the GaN-based semiconductor laser chip 200.

According to the first embodiment, cleavage introduction steps 19a and 19b for performing cleavage having a depth D1 (about 20 μm) are formed on boundaries between the cleavages 17 and 18 in the substrate 11, the semiconductor layer 12 and the current blocking layer 14 from the upper surface of the GaN-based semiconductor laser chip 200, as shown in FIG. 4. The cleavage introduction steps 19a and 19b are examples of the "first recess portion" in the present invention. These cleavage introduction steps 19a and 19b are formed only on a region of a side (side along arrow B) opposite to the first side (side along arrow A) of the ridge portion 12a at a prescribed interval W3 (at least about 70 μm) from the ridge portion 12a (waveguide) along the direction (along arrow A (along arrow B)) orthogonal to the ridge portion 12a (waveguide).

More specifically, each of the cleavage introduction steps 19a and 19b is so formed at a prescribed distance W3 (=about 90 μm) along arrow B from the ridge portion 12a (waveguide) as to reach the facet along arrow B of the GaN-based semiconductor laser chip 200. Each of the cleavage introduction steps 19a and 19b has a width W4 (=about 40 μm) along arrow B.

According to the first embodiment, the cleavage introduction steps 19a and 19b are formed on a region not provided with the p-side pad electrode 15.

According to the first embodiment, separation introduction steps 20a and 20b for performing separation are formed on ends of the substrate 11 and the n-side electrode 16 along arrow A and along arrow B (in the vicinity of boundaries between the substrate 11 and the n-side electrode 16 and the second device side surface 202 and the first device side surface 201) along the extensional direction (direction C) of the ridge portion 12a (waveguide) from the back surface of the GaN-based semiconductor laser chip 200, as shown in FIG. 4.

The separation introduction steps 20a and 20b are examples of the "second recess portion" in the present invention.

According to the first embodiment, a region where the groove portion 30 of the cleavage plane 17 (18) and the cleavage introduction step 19a (19b) intersect with each other has a depth D2 of about 25 μm. In other words, a dip deeper than the groove portion 30 and the cleavage introduction step 19a (19b) is partially formed in the vicinity of the boundary between the cleavage plane 17 (18) and the first device side surface 201.

As to the detailed structures of the substrate 11 and the semiconductor layer 12, the substrate 11 made of n-type GaN is doped with oxygen, and consists of a hexagonal structure. The semiconductor layer 12 has a main surface consisting of a C plane (plane orientation (0001)) of a Ga surface. In the semiconductor layer 12, a buffer layer 21 arranged on the substrate 11 and consisting of a Ge-doped n-type GaN layer is formed, as shown in FIG. 5. An n-type cladding layer 22 of n-type $Al_{0.05}Ga_{0.95}N$ is formed on this buffer layer 21.

An n-side optical guide layer 23 of undoped GaN is formed on the n-type cladding layer 22. An active layer 24 having a multiple quantum well (MQW) structure is formed on this n-side optical guide layer 23. This active layer 24 has a structure obtained by alternately stacking two barrier layers (not shown) of undoped GaN and three well layers (not shown) of undoped $In_{0.1}Ga_{0.9}N$.

A p-side optical guide layer 25 of undoped GaN is formed on the active layer 24. A cap layer 26 of undoped $Al_{0.3}Ga_{0.7}N$ is formed on this p-side optical guide layer 25. This cap layer 26 has a function of suppressing deterioration of the crystal quality of the active layer 24 by suppressing desorption of In atoms of the active layer 24.

A p-type cladding layer 27, doped with Mg, of p-type $Al_{0.05}Ga_{0.95}N$ is formed on the cap layer 26. This p-type cladding layer 27 has a projecting portion, formed by etching a prescribed region from the upper surface of the p-type cladding layer 27, having a width of about 1.5 μm and extending in the direction C (see FIG. 4). A p-side contact layer 28 of undoped $In_{0.05}Ga_{0.9}N$ is formed on the projecting portion of the p-type cladding layer 27. The projecting portion of the p-type cladding layer 27 and the p-side contact layer 28 form the ridge portion 12a becoming a current injection region and having a function as the waveguide. FIG. 5 slightly exaggeratingly shows thicknesses of the respective layers of the semiconductor layer 12 constituting the groove portion 30.

A manufacturing process (wafer process) in a wafer state of the GaN-based semiconductor laser chip 200 according to the first embodiment will be now described with reference to FIGS. 5 to 9.

Figure 6:
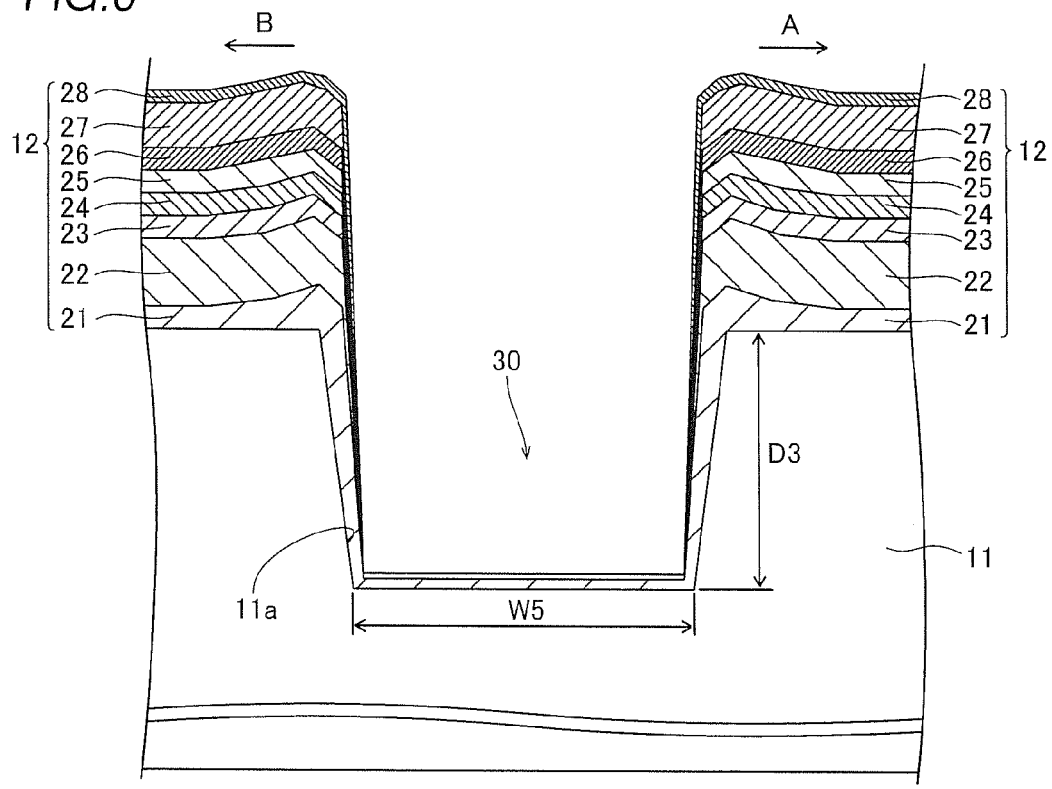
FIG. 6 is a sectional view for illustrating the manufacturing process (wafer process) in the wafer state of the GaN-based semiconductor laser chip according to the first embodiment shown in FIG. 4.
Figure 7:
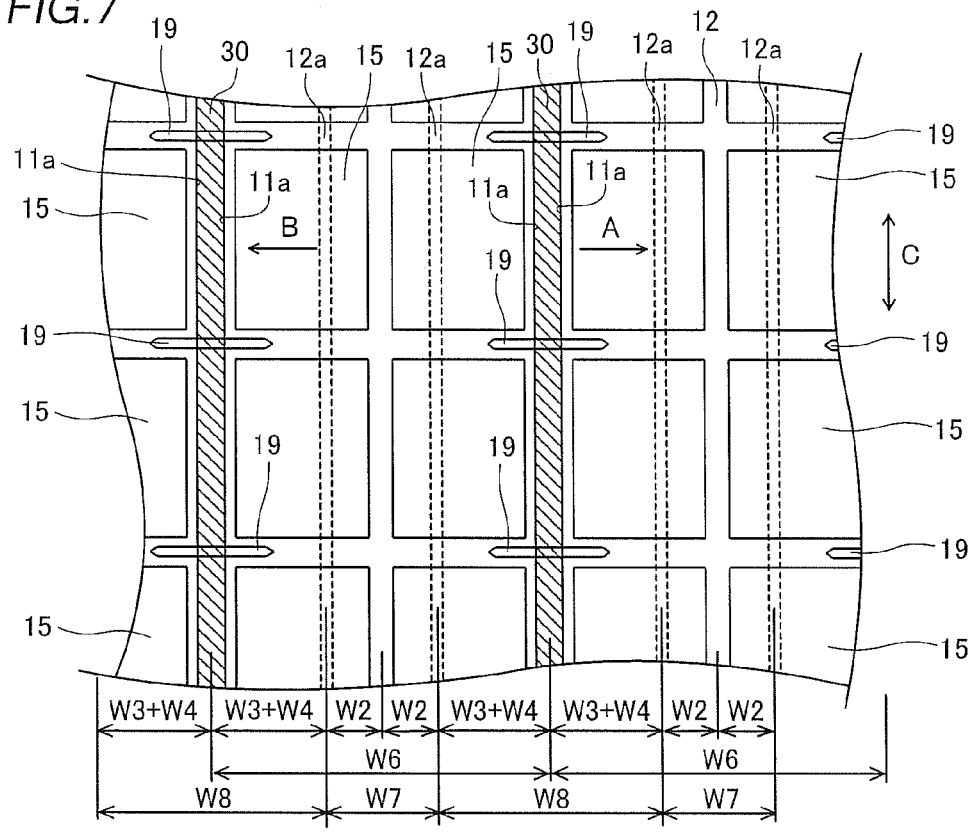
FIG. 7 is a plan view for illustrating the manufacturing process (wafer process) in the wafer state of the GaN-based semiconductor laser chip according to the first embodiment shown in FIG. 4.

As shown in FIG. 6, the groove portions 11a having widths W5 (about twice the width W0) of about 20 μm and depths D3 of about 5 μm are formed on the main surface of the substrate 11 made of n-type GaN. The groove portions 11a are so formed in a striped manner at intervals W6 (=about 400 μm) along arrow A (along arrow B) as to extend in the direction C orthogonal to the direction along arrow A (along arrow B), as shown in FIG. 7. In a step of forming the groove portions 11a, an $SiO_2$ film (not shown) is formed on the main surface of the substrate 11 by EB deposition, and striped openings are formed on the $SiO_2$ film by photolithography and etching. Thereafter the striped groove portions 11a (see FIG. 7) are formed on the substrate 11 employing the $SiO_2$ film as a mask by RIE. The groove portions 11a are examples of the "third recess portion" in the present invention.

Figure 5:
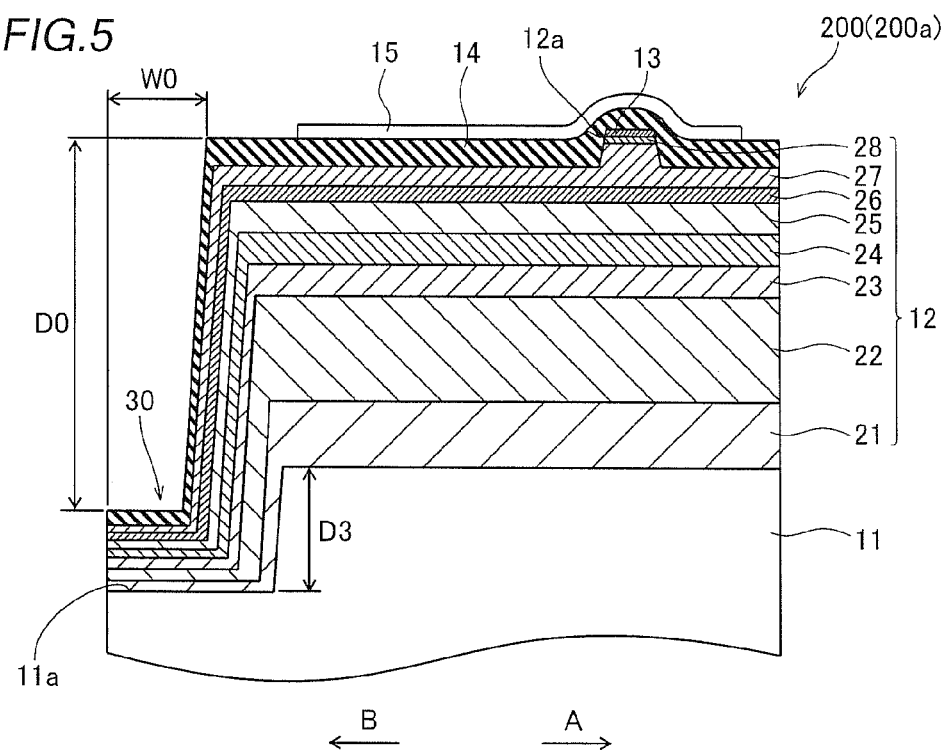
FIG. 5 is a sectional view showing the detailed structure of a semiconductor layer of the GaN-based semiconductor laser chip shown in FIG. 4.

After the $SiO_2$ film (not shown) is removed, the buffer layer 21 consisting of the Ge-doped n-type GaN layer, the n-type cladding layer 22 of n-type $Al_{0.05}Ga_{0.95}N$ and the n-side optical guide layer 23 of undoped GaN are successively grown on the substrate 11 by MOVPE (Metal Organic Vapor Phase Epitaxy) at a substrate temperature of about 1150° C., as shown in FIGS. 5 and 6.

Thereafter the active layer 24 is formed by alternately growing the three well layers (not shown) of undoped $In_{0.1}Ga_{0.9}N$ and the two barrier layers (not shown) of undoped GaN on the n-side optical guide layer 23 by MOVPE at a substrate temperature of about 850° C. Then, the p-side optical guide layer 25 of undoped GaN and the cap layer 26 of undoped $Al_{0.3}Ga_{0.7}N$ are successively formed on the active layer 24.

Thereafter the p-type cladding layer 27, doped with Mg, of p-type $Al_{0.05}Ga_{0.95}N$ is grown on the cap layer 26 by MOVPE at a substrate temperature of about 1150° C.

Then, the p-side contact layer 28 of undoped $In_{0.05}Ga_{0.95}N$ is formed on the p-type cladding layer 27 by MOVPE at a substrate temperature of about 850° C.

According to the first embodiment, the groove portion 30 is formed in the semiconductor layer 12 on each groove portion 11a formed on the substrate 11 in a state where a crystal growth layer (semiconductor layer 12) has a thickness extremely thinner than a crystal growth layer formed on the main surface except the groove portion 11a, as shown in FIG. 6. The groove portion 30 is an example of the "first region" in the present invention. In this case, the semiconductor layer 12 is divided in the direction along arrow A (along arrow B) by the groove portion 30, whereby tensile stress in the direction along arrow A (along arrow B) perpendicular to the extensional direction (direction C in FIG. 7) of the groove portion 11a applied to the semiconductor layer 12 is relaxed. The crystal growth layer (semiconductor layer 12) is so formed as to thickly rise in the vicinity of the groove portion 30, and the film thickness and the film composition of this portion on the semiconductor layer 12 are different from those of a region of the semiconductor layer 12 separated from the groove portion 30 along arrow A (along arrow B). The reason why crystal growth is performed in this manner is conceivable as follows:

The inner side surfaces of each groove portion 11a are a (11-20) plane different from the (0001) plane which is the main surface of the substrate 11 made of n-type GaN, and hence the growth rate of the crystal growth layer (semiconductor layer 12) is conceivably low due to the difference in the plane orientation. On the other hand, the main surface of the substrate 11 in the vicinity of the groove portion 11a, which is not formed with the groove portion 11a, or the bottom portion of the groove portion 11a is the (0001) plane identical with the main surface of the substrate 11, and hence the crystal growth of the semiconductor layer 12 should be performed similarly to a region sufficiently separated from the groove portion 11a. However, respective constituent atoms which should be originally supplied to the bottom portion of the groove portion 11a are not supplied to the bottom portion of the groove portion 11a due to some kind of influence by the inner side surfaces ((11-20) plane) of the groove portion 11a, while the constituent atoms are supplied on the main surface of the substrate 11 in the vicinity of the groove portion 11a. Consequently, the semiconductor layer 12 thickly grows on the main surface of the substrate 11 in the vicinity of the groove portions 11a, and hence the crystal growth layer (semiconductor layer 12) is conceivably formed so as to thickly rise in the vicinity of the inner side surfaces of the groove portion 30 as shown in FIG. 6.

Each groove portion 11a formed on the substrate 11 before the crystal growth is preferably so formed that the depth D3 is at least the thickness of the semiconductor layer 12, in order for the groove portion 30 to divide the semiconductor layer 12 in the direction along arrow A (along arrow B) as described above. In this case, each groove portion 11a is preferably so formed that the width W5 is about 10 μm to about 30 μm. FIG. 7 shows a state where groove portions 30 (hatched regions) are formed on the groove portions 11a of the substrate 11 (see FIG. 6).

Thereafter the ridge portions 12a and the p-side electrodes 13 are formed by employing vacuum evaporation and etching. More specifically, the Pt film and the Pd film are formed on the p-side contact layer 28 by vacuum evaporation successively from the p-side contact layer 28. Then, etching is employed for etching the Pt film and the Pd film through a mask of photoresist (not shown) extending in the direction C (see FIG. 4), and etching the p-side contact layer 28 and a prescribed region from the upper surface of the p-type cladding layer 27. Thus, the two ridge portions 12a having the widths of about 1.5 μm constituted by the p-side contact layer 28 and the projecting portions of the p-type cladding layer 27 and the p-side electrodes 13 arranged on the respective ridge portions 12a are formed between a plurality of the groove portions as shown in FIG. 5.

According to the first embodiment, at this time, the ridge portions 12a (shown by broken lines in FIG. 7) are so formed as to extend in the direction (<1-100> direction) (direction C) substantially orthogonal to the <11-20> direction (along arrow A (along arrow B)) which is the cleavage direction as shown in FIG. 7. The ridge portions 12a are so formed on positions separated from the centers of the groove portions 11a (groove portions 30) formed on the substrate 11 at the intervals W6 (=about 400 μm) along arrow A and along arrow B by about 130 μm (=W3+W4). Therefore, the ridge portions 12a are so formed alternately at two different intervals, i.e., intervals W7 (=about 140 μm) and intervals W8 (=about 260 μm). Thus, the semiconductor layer 12 consisting of the buffer layer 21, the n-type cladding layer 22, the n-side optical guide layer 23, the active layer 24, the p-side optical guide layer 25, the cap layer 26, the p-type cladding layer 27 and the p-side contact layer 28 is formed as shown in FIG. 5.

Figure 8:
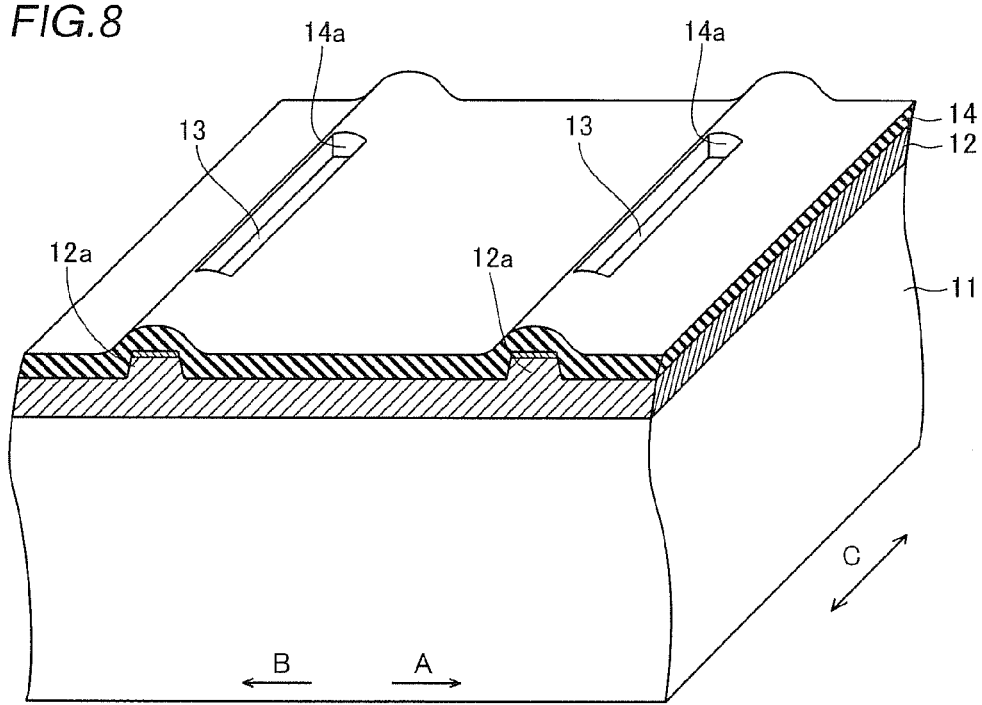
FIGS. 8 and 9 are perspective views for illustrating the manufacturing process (wafer process) in the wafer state of the GaN-based semiconductor laser chip according to the first embodiment shown in FIG. 4.

Thereafter the current blocking layer 14 made of the $SiO_2$ film having the thickness of about 300 nm is formed on the semiconductor layer 12 by plasma CVD to cover the A-side electrodes 13, as shown in FIG. 8.

Then, etching is employed for etching the current blocking layer 14 through a mask of photoresist (not shown), for forming openings 14a (see FIG. 8) on portions of the current blocking layer 14 formed on regions other than regions for forming the cleavage planes 17 and 18 in the regions immediately above the p-side electrodes 13. Thus, the upper surfaces of the p-side electrodes 13 are exposed.

Figure 9:
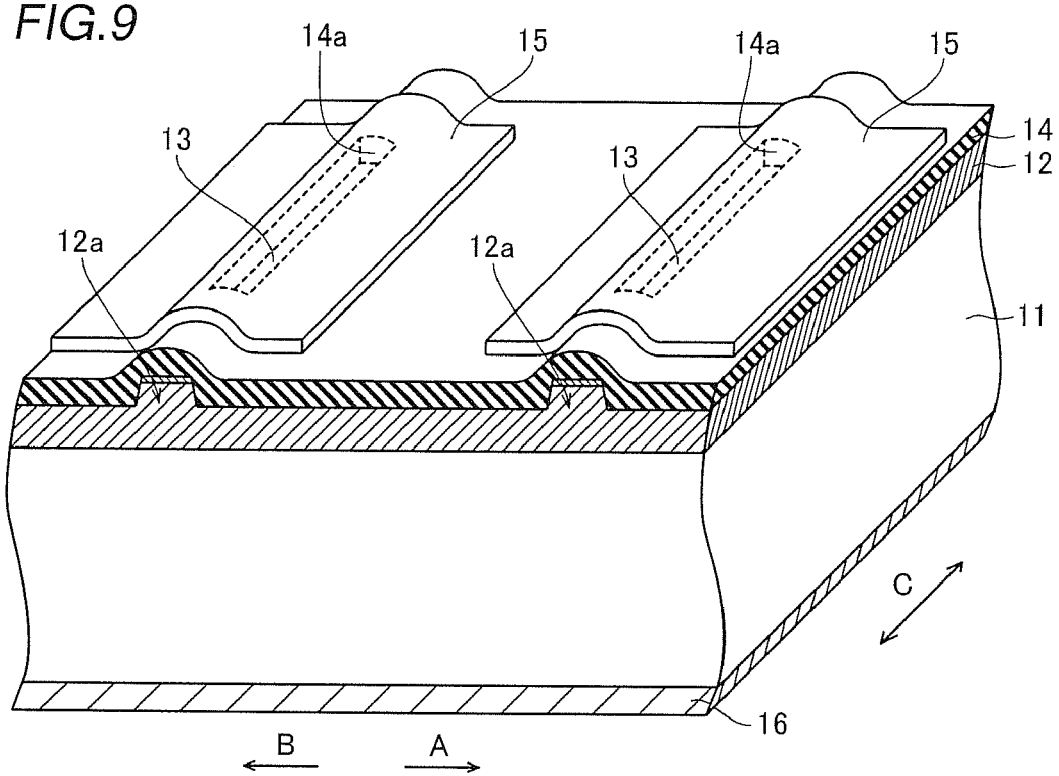

Thereafter p-side pad electrodes 15 are formed by stacking Ti films and Au films on upper portions of the A-side electrodes 13 exposed on the opening 14a and prescribed regions of the current blocking layer 14 successively from the side of the p-side electrodes 13 and the current blocking layer 14 by vacuum evaporation and a lift-off method, as shown in FIG. 9. More specifically, photoresist film (not shown) is formed on a region of the current blocking layer 14 other than regions enclosed with lines inward by about 30 μm from positions for forming the facets (four surfaces of the first device side surface 201, the second device side surface 202 and the cleavage planes 17 and 18) of the GaN-based semiconductor laser chip 200. Then, the Ti films and the Au films are formed on the A-side electrodes 13 and the current blocking layer 14 successively from the p-side electrodes 13 and the current blocking layer 14 by vacuum evaporation. Thereafter the photoresist film (not shown) is removed by the lift-off method, whereby the p-side pad electrodes 15 are formed on the regions of the p-side electrodes 13 and the current blocking layer 14 enclosed with the lines inward by about 30 μm from the positions (see FIG. 4) for forming the facets (four surfaces of the first device side surface 201, the second device side surface 202 and the cleavage planes 17 and 18) of the GaN-based semiconductor laser chip 200. At this time, the p-side pad electrodes 15 are so formed that the ridge portions 12a constituting waveguides are arranged on regions approaching sides (sides along arrow B) opposite to the first sides (sides along arrow A) by about 30 μm from the centers of the p-side pad electrodes 15 along arrow A (along arrow B). Each p-side pad electrode 15 is so formed that the length (width) along arrow A (along arrow B) is about 140 μm and the length (depth) in the direction C is about 340 μm.

Then, the back surface of the substrate 11 is polished until the thickness of the substrate 11 reaches about 100 μm, for example. Thereafter the n-side electrode 16 is formed on the back surface of the substrate 11 by stacking the Ti film, the Pt film and the Au film successively from the substrate 11 by vacuum evaporation, as shown in FIG. 9. A wafer having GaN-based semiconductor laser chips 200 arranged in the form of a matrix is completed in the aforementioned manner.

A manufacturing process (separation process) subsequent to the wafer process for the GaN-based semiconductor laser chip 200 according to the first embodiment will be now described with reference to FIGS. 4, 6, 7 and 9 to 12.

According to the first embodiment, cleavage introduction recess portions 19 extending in the direction (along arrow A and along arrow B) orthogonal to the ridge portions 12a are formed at intervals of about 400 μm along the extensional direction (direction C) of the striped ridge portions 12a from the side of the semiconductor layer 12 with a diamond point or a laser beam, as shown in FIG. 7. At this time, each cleavage introduction recess portion 19 is so formed as to be orthogonal to the groove portion 30 and extend along arrow A and along arrow B from the central position of the groove portion 30 by 40 μm (corresponding to W4 in FIG. 4). The cleavage introduction steps 19a and 19b are examples of the "first recess portion" in the present invention. At this time, the cleavage introduction recess portions 19 are formed on regions not provided with the p-side pad electrodes 15, whereby development of metal swarfs or the like can be suppressed when forming the same with the diamond point or the laser beam. Thus, the p-side layers (the p-side optical guide layer 25, the cap layer 26, the p-type cladding layer 27, the p-side contact layer 28, the p-side electrodes 13 and the p-side pad electrodes 15) and the n-side layers (the n-side electrode 16, the substrate 11, the buffer layer 21, the n-type cladding layer 22 and the n-side optical guide layer 23) can be inhibited from electrically short-circuiting by metal swarfs or the like.

According to the first embodiment, the cleavage introduction recess portions 19 are not formed on regions within about 70 μm along arrow A or along arrow B from the ridge portions 12a but the centers of the cleavage introduction recess portions 19 along arrow A (along arrow B) are formed at a distance W3+W4 (=90+40=about 130 μm) from the adjacent ridge portions 12a (waveguides). Thus, reduction of the distance between the cleavage introduction recess portions 19 and the ridge portions 12a can be suppressed, whereby damage of the ridge portions 12a can be suppressed when forming the cleavage introduction recess portions 19. Further, the cleavage introduction recess portions 19 are so formed as to have depths D1 (=about 20 μm) on regions where the cleavage introduction recess portions 19 and the groove portions 30 do not intersect with each other and to have depths D2 (=about 25 μm) on regions where the cleavage introduction recess portions 19 and the groove portions 30 intersect with each other. In other words, the grooves portions 30 are formed on the substrate 11, the semiconductor layer 12 and the current blocking layer 14 from the upper surface of the GaN-based semiconductor laser chip 200, and the substrate 11 is exposed on the bottom portions of the groove portions 30. In the state before the wafer is cleaved, the cleavage introduction recess portions 19 are in the form of grooves.

Figure 10:
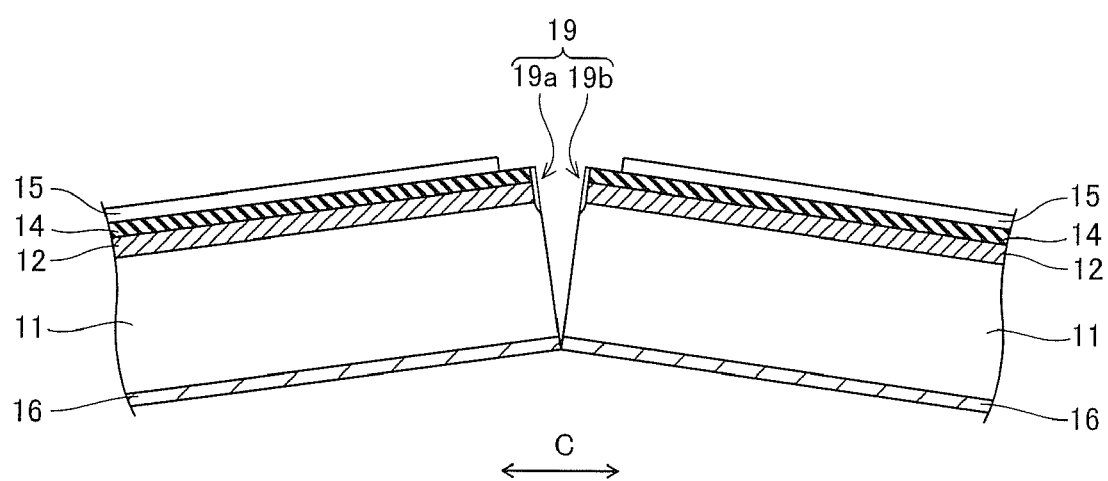
FIG. 10 is a sectional view for illustrating the manufacturing process (separation process) subsequent to the wafer process for the GaN-based semiconductor laser chip according to the first embodiment shown in FIG. 4.
Figure 11:
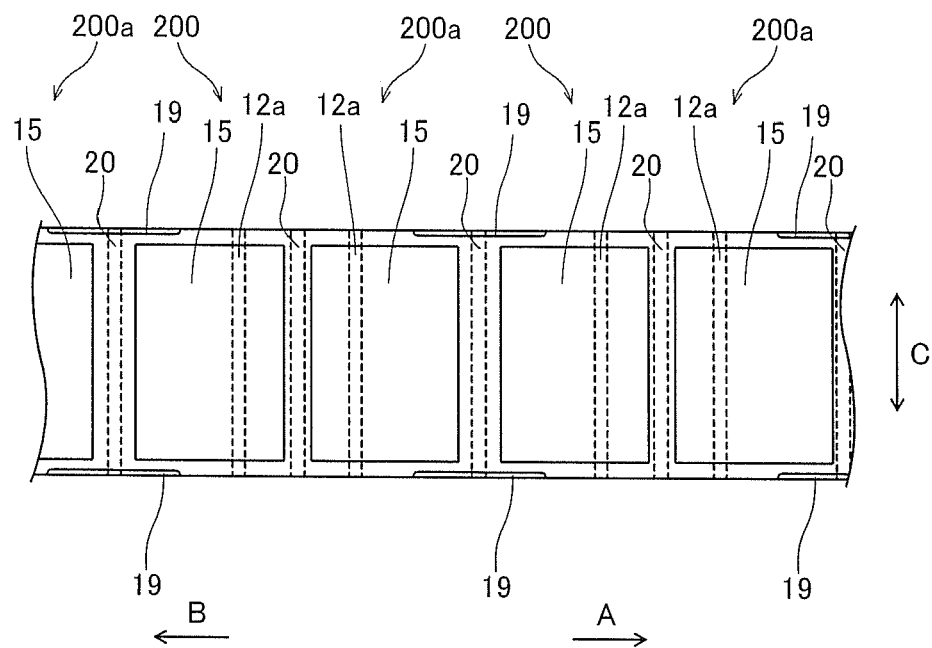
FIG. 11 is a plan view for illustrating the manufacturing process (separation process) subsequent to the wafer process for the GaN-based semiconductor laser chip according to the first embodiment shown in FIG. 4.

In this state, the wafer is cleaved on the position of each cleavage introduction recess portion 19 along arrow A (along arrow B) (see FIG. 9) by applying a load while fulcruming the side of the lower surface (back surface) of the substrate 11 so that the side of the upper surface (formed with the semiconductor layer 12 with respect to the substrate 11) of the wafer opens, as shown in FIG. 10. Thus, the wafer is formed into a bar having the GaN-based semiconductor laser chips 200 aligned with each other along arrow A (along arrow B), as shown in FIG. 11. At this time, the wafer is cleaved while fulcruming the side of the lower surface of the substrate 11 so that the side of the upper surface opens, whereby application of the load to the ridge portions 12a of the semiconductor layer 12 can be suppressed. Thus, mechanical damage of the ridge portions 12a of the semiconductor layer 12 can be suppressed, whereby deterioration of the laser characteristics can be suppressed.

Figure 12:
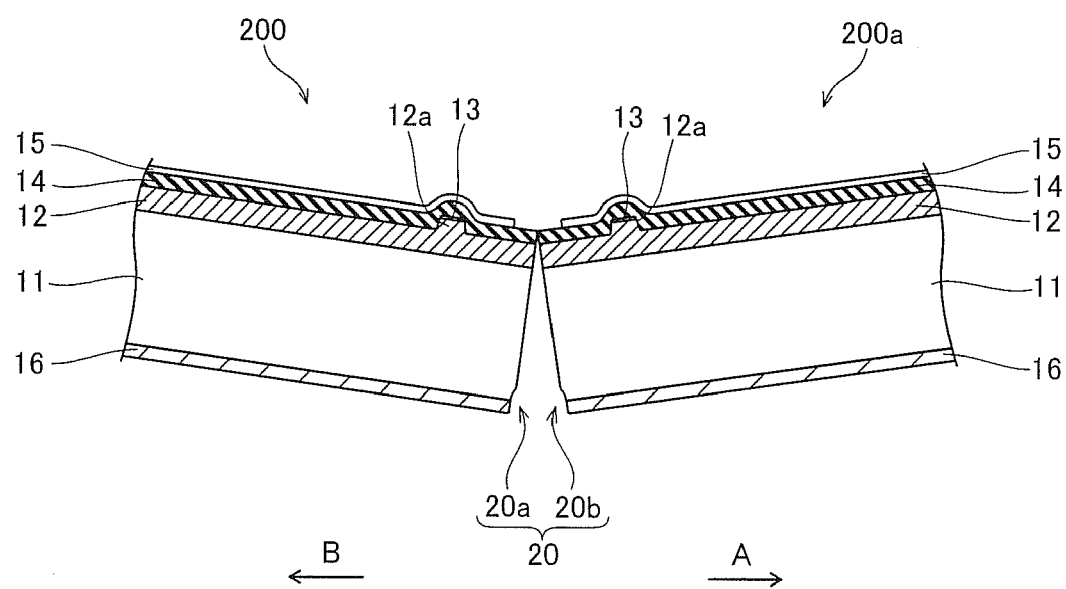
FIG. 12 is a sectional view for illustrating the manufacturing process (separation process) subsequent to the wafer process for the GaN-based semiconductor laser chip according to the first embodiment shown in FIG. 4.

Then, separation introduction recess portions 20 are formed at intervals of about 200 μm in the extensional direction (direction C) (see FIG. 11) of the striped ridge portions 12a from the back surface of the substrate 11 of the wafer cleaved in the form of a bar with the diamond point or the laser beam, as shown in FIGS. 11 and 12. At this time, the separation introduction recess portions 20 are formed on every second region opposed to the groove portion 30 (see FIG. 7) in the thickness direction of the substrate 11. Thus, each separation introduction recess portion 20 is formed also on a region opposed to the center of the adjacent ridge portions 12a having a smaller interval W7 among the ridge portions 12a alternately having the different two intervals. Consequently, the separation introduction recess portions 20 are arranged on the regions opposed to the positions separated by about 70 μm and about 130 μm from both sides of each ridge portion 12a respectively. Further, the separation introduction recess portions 20 are formed on the substrate 11 and the n-side electrode 16 from the side of the back surface of the GaN-based semiconductor laser chip 200. The separation introduction recess portions 20 can be formed at prescribed distances from the ridge portions 12a not only in the thickness direction (vertical direction) but also in the cross direction with respect to the substrate 11, whereby damage of the ridge portions 12a can be suppressed when forming the separation introduction recess portions 20. Further, separation of the wafer can be more easily performed on portions of the substrate 11 having small thicknesses reduced due to the groove portions 30 and the separation introduction recess portions 20 which are opposed to each other, than on portions of the separation introduction recess portions 20 which are not opposed to the groove portions 30. In the state before the wafer cleaved in the form of a bar is separated, the separation introduction recess portions 20 are in the form of grooves. The separation introduction recess portions 20 are examples of the "second recess portion" in the present invention.

In this state, the bar-shaped wafer is separated on the position of each separation introduction recess portion 20 along arrow C (see FIG. 11) by applying a load while fulcruming the side of the semiconductor layer 12 (the side of upper side) so that the side of the lower surface (back surface) of the GaN-based semiconductor laser chip 200 opens, as shown in FIG.

12. Thus, the bar-shaped wafer is separated into the GaN-based semiconductor laser chip 200 (200a) having the length (width) of about 200 μm along arrow A (along arrow B) and the length (depth) of about 400 μm in the direction C as shown in FIG. 4, thereby manufacturing a large number of the GaN-based semiconductor laser chips 200.

According to the first embodiment, the two GaN-based semiconductor laser chips 200 and 200a having a symmetrical shape in the direction along arrow A (along arrow B) with respect to the separation introduction recess portion 20 employed as a symmetrical axis are obtained.

According to the first embodiment, as hereinabove described, the ridge portion 12a constituting the waveguide extending in the direction C in the striped (slender) manner is formed on the region approaching the first side (side along arrow A) by the distance W1 (=about 30 μm) from the center of the semiconductor layer 12 along arrow A (along arrow B) orthogonal to the direction C. Thus, bonding of a metal wire onto the ridge portion 12a constituting the waveguide can be suppressed in a case of bonding the metal wire to the center of the upper surface of the semiconductor layer 12 for supplying power to the upper surface of the semiconductor layer 12, whereby damage of the ridge portion 12a constituting the waveguide can be suppressed in bonding. Consequently, deterioration of the laser characteristics can be suppressed.

According to the first embodiment, the groove portion 30 is so formed on the surface of the semiconductor layer 12 as to extend parallel to the extensional direction C of the ridge portions 12a and the thickness of the semiconductor layer 12 on the groove portion 30 is smaller than the thickness of the semiconductor layer 12 on the region other than the groove portion 30, and hence the semiconductor layer 12 is divided by the groove portion 30 in the direction (along arrows A and B) orthogonal to the extensional direction (direction C) of the groove portion 30 with respect to the center of the groove portion 30. Thus, tensile stress caused along arrow A (along arrow B) (in the extensional direction of the cavity facets) perpendicular to the direction C can be rendered smaller than tensile stress caused in the extensional direction C of the ridge portions 12a due to difference in the lattice constants between the substrate 11 (GaN) and the semiconductor layer 12 (AlGaN) in forming the semiconductor layer. Consequently, microcracks voluntarily caused between the cleavage introduction recess portions 19 adjacent to each other can be inhibited from formation while causing steps in the direction C, whereby the cleavage is excellently performed along a plurality of the cleavage introduction recess portions 19 and the smooth cleavage planes 17 and 18 (cavity facets) are obtained. Thus, damage of the ridge portion 12a constituting the waveguide can be suppressed.

In the manufacturing process of the GaN-based semiconductor laser chip 200, when the groove portions 30 are formed by stacking the semiconductor layer 12 on the substrate 11 while covering the recessed groove portions 11a previously formed on the main surface of the substrate 11, the groove portions are formed at prescribed intervals from the vicinity of regions formed with the ridge portions 12a (waveguides) so that nonuniformity of the crystal growth layer caused by the groove portions 30 can be inhibited from influencing the ridge portions 12a, and hence deterioration of the laser characteristics of the devices can be further suppressed.

According to the first embodiment, the cleavage introduction steps 19a and 19b (cleavage introduction recess portions 19) are formed only on the regions of the sides (sides along arrow B) opposite to the first sides of the ridge portions 12a from the side of the semiconductor layer 12 (upper side) and the cleavage introduction steps 19a and 19b (cleavage introduction recess portions 19) are not formed on the regions on the first sides (sides along arrow A) of the ridge portions 12a, whereby the cleavage introduction steps 19a and 19b (cleavage introduction recess portions 19) can be formed at the regions separated from the ridge portions 12a constituting the waveguides and hence damage of the ridge portions 12a constituting the waveguides can be suppressed when forming the cleavage introduction steps 19a and 19b (cleavage introduction recess portions 19) from the side of the semiconductor layer 12 (upper side). This also can suppress deterioration of the laser characteristics.

According to the first embodiment, the p-side pad electrode 15 is formed on the region enclosed with the lines inward by about 30 μm from the cleavage introduction steps 19a and 19b (cleavage introduction recess portions 19) so that the p-side pad electrode 15 and the cleavage introduction steps 19a and 19b are formed at the prescribed interval of about 30 μm, whereby a leakage current can be inhibited from increase resulting from adhesion of a conductive material forming the p-side pad electrode 15 to the cleavage introduction steps 19a and 19b also when the conductive material constituting the A-side pad electrode 15 scatters.

According to the first embodiment, the separation introduction steps 20a and 20b extending in the direction C are formed on the back surface of the substrate 11, whereby the thicknesses of the portions of the substrate 11, which are formed with the separation introduction steps 20a and 20b, are reduced and hence separation of the wafer can be easily performed on the portions formed with the separation introduction steps 20a and 20b along the direction C at the time of separation in the manufacturing process.

According to the first embodiment, the separation introduction step 20b is provided on the position of the back surface of the substrate 11 opposed to the groove portion, whereby the thickness of the substrate 11 can be further reduced due to the groove portion 30 and the separation introduction step 20b and hence separation of the wafer can be further easily performed along the direction C.

According to the first embodiment, the groove portion 11a extending parallel to the first direction (direction C) is formed on the region of the surface of the substrate 11 opposed to the groove portion 30, whereby the substrate 11 can be easily separated on the portion of the groove portion 11a along the direction C. The thickness of the semiconductor layer 12 formed on the groove portion 11a, that is, the thickness of the semiconductor layer 12 on the groove portion 30 can be rendered smaller than the thickness of the semiconductor layer 12 formed on other region, and hence division of the semiconductor layer 12 in the direction along arrow A (direction along arrow B) can be easily performed on the groove portion 30 on the groove portion 11a.

According to the first embodiment, the depth D3 (=about 5 μm) of the groove portion 11a is rendered larger than the thickness of the semiconductor layer 12, whereby the groove portion 30 for separating the semiconductor layer 12 in the direction along arrow A (along arrow B) can be easily formed on the semiconductor layer 12 which is crystal-grown on the surface of the substrate 11.

According to the first embodiment, the groove portion 30 is formed to reach a part of the substrate 11 from the surface of the semiconductor layer 12, whereby separation can be easily performed on the portion of the substrate 11 having a small thickness reduced due to the groove portion 30 at the time of separation.

According to the first embodiment, the groove portion 30 is so formed that the width in the direction (along arrow A) orthogonal to the extensional direction (direction C) of the ridge portion 12a is increased upward so that ends of the semiconductor layer 12 (inner side surfaces of the groove portion 30) bent due to separation are unlikely to come into contact with each other when performing separation so as to open the lower surface of the bar-shaped wafer (back surface of the substrate 11), and hence damage of the semiconductor layer 12 at the time of the separation can be suppressed.

According to the first embodiment, the cleavage introduction steps 19a and 19b are so formed that the width in the direction (along arrow A (along arrow B)) orthogonal to the extensional direction of the ridge portion 12a is increased upward so that energy for forming ends of the cleavage introduction steps 19a and 19b by laser application or the like can be reduced below energy for forming the bottom portions of the cleavage introduction steps 19a and 19b by laser application or the like, whereby a thermal influence on the ridge portion 12a close to the ends of the cleavage introduction steps 19a and 19b can be suppressed, and deterioration of the ridge portion 12a can be suppressed.

According to the first embodiment, the groove portion 30 and the cleavage introduction step 19a (19b) are so formed that the depth D2 (=about 25 μm) on the region where the groove portion 30 and the cleavage introduction step 19a (19b) intersect with each other is larger than the depth D0 (=about 5 μm) of the groove portion 30 and the depth D1 (=about 20 μm) of the cleavage introduction step 19a (19b) on the region where the groove portion 30 and the cleavage introduction step 19a (19b) do not intersect with each other, whereby cleavage is performed starting from the cleavage introduction recess portions 19 more deeply formed up to the inside of the substrate 11 when cleaving the bar-shaped wafer in the manufacturing process and hence the smooth cleavage planes 17 and 18 (cavity facets) can be further easily obtained.

According to the first embodiment, the separation introduction steps 20a and 20b are so formed as to have the length substantially identical to the length between the cleavage planes 17 and 18 of the ridge portion 12a (waveguide), whereby separation of the wafer can be reliably performed in the extensional direction C of the separation introduction steps 20a and 20a when forming the GaN-based semiconductor laser chip 200 by separation.

According to the first embodiment, the separation introduction steps 20a and 20b are formed on the n-side electrode 16 and the substrate 11 so that the separation introduction step 20a (20b) reaches a part of the substrate 11 from the lower surface of the n-side electrode 16, whereby separation can be easily performed on the portion of the substrate 11 having a small thickness reduced due to the separation introduction step 20a (20b) when performing separation in the manufacturing process.

According to the first embodiment, the substrate 11 and the semiconductor layer 12 are formed by a nitride-based semiconductor such as GaN, whereby the GaN-based semiconductor laser chip 200 in which damage of the waveguide and deterioration of the laser characteristics are suppressed can be formed.

The manufacturing process according to the first embodiment comprises a step of performing separation so that the GaN-based semiconductor laser chip 200 has the waveguide on the region approaching the first side (side along arrow A) in the cross direction from the center of the semiconductor layer 12. In other words, the ridge portion 12a constituting the waveguide located between the first device side surface 201 and the second device side surface 202 of the semiconductor layer 12 formed by performing the separation step is arranged on the region approaching the side of the second device side surface 202 from the center of the semiconductor layer 12. Thus, bonding of the metal wire onto the ridge portion 12a constituting the waveguide can be suppressed in a case of bonding the metal wire to the center of the side of the upper surface of the semiconductor layer 12 for supplying power to the upper surface of the semiconductor layer 12, whereby damage of the ridge portion 12a constituting the waveguide can be suppressed in bonding. Consequently, deterioration of the laser characteristics can be suppressed.

The manufacturing process according to the first embodiment comprises a step of forming the semiconductor layer 12 including the groove portions 30 extending parallel to a plurality of the waveguides (ridge portions 12a) and the thickness of the semiconductor layer 12 on the groove portion 30 is smaller than the thickness of the semiconductor layer 12 on the region other than the groove portion 30. Thus, the semiconductor layer 12 is divided by the groove portions 30 in the direction (cross direction of the semiconductor laser device) orthogonal to the extensional direction (direction C) of the groove portions 30 with respect to the groove portions 30 employed as centers. Thus, tensile stress caused in the direction (cross direction of the semiconductor laser device) orthogonal to the extensional direction of the waveguide can be rendered smaller than tensile stress caused in the extensional direction (direction C) of the waveguides due to difference in the lattice constants between the substrate 11 and the semiconductor layer 12 in forming the semiconductor layer. Consequently, microcracks voluntarily caused between the cleavage introduction recess portions 19 can be inhibited from formation while causing steps in the extensional direction of the waveguide at the time of the cleavage, whereby the cleavage is excellently performed and the smooth cleavage planes 17 and 18 (side surfaces including the facets of the waveguide forming the cavity facets) are obtained. Thus, damage of the ridge portion 12a constituting the waveguide can be suppressed.

In the manufacturing process according to the first embodiment, when the groove portions 30 are formed on the positions separated by the prescribed distances from the waveguides by stacking the semiconductor layer 12 on the substrate 11, the groove portions are formed at prescribed intervals from the vicinity of regions formed with the ridge portions 12a (waveguides) so that nonuniformity of the crystal growth layer caused by the groove portions 30 can be inhibited from influencing the ridge portions 12a, and hence deterioration of the laser characteristics of the devices can be further suppressed.

The manufacturing process according to the first embodiment comprises a step of forming the plurality of cleavage introduction recess portions 19 between the plurality of waveguides (ridge portions 12a) from the side of the semiconductor layer 12 so as to intersect with the groove portions 30 and to extend in the direction (along arrow A (along arrow B)) orthogonal to the prescribed extensional direction of the waveguides (the first direction (direction C) parallel to the surface of the substrate 11). In other words, the manufacturing process according to the first embodiment comprises a step of forming a plurality of the cleavage introduction recess portions 19 intersecting with the groove portions 30 and extending in the direction (along arrow A (along arrow B)) orthogonal to the first direction (direction C) on the regions of the surface of the semiconductor layer 12 between a plurality of the waveguides at distances from the waveguides. Thus, the cleavage introduction recess portions 19 can be formed on the positions separated from the waveguides and hence damage of the ridge portions 12a constituting the waveguides can be suppressed when forming the cleavage introduction recess portions 19 from the side of the semiconductor layer 12. This also can suppress deterioration of the laser characteristics.

In the manufacturing process according to the first embodiment, the step of the semiconductor layer 12 includes a step of forming a plurality of the ridge portions 12a (waveguides) alternately having different two intervals W7 and W8 and the groove portions 30 located between the adjacent ridge portions 12a (waveguides) having larger intervals W8 (=about 260 μm) among the two intervals, whereby each ridge portion 12a (waveguide) located between the first device side surface 201 and the second device side surface 202 of the semiconductor layer 12 formed by the separation step can be easily arranged on the region approaching the side of the side surface 202 from the center of the semiconductor layer 12.

In the manufacturing process according to the first embodiment, the separation step is performed along the groove portions 30, whereby the wafer is separated along the groove portions 30 separated from the positions formed with the ridge portions 12a (waveguides) and hence damage of the ridge portions 12a can be easily suppressed at the time of separation.

In the manufacturing process according to the first embodiment, a step of forming the separation introduction recess portions 20 extending parallel to the first direction (direction C) on the side of the back surface of the substrate 11 opposite to the surface of the substrate is performed in advance of the separation step, whereby separation can be reliably performed on the portions of the substrate 11 having small thicknesses reduced due to the groove portions 30 and the separation introduction recess portions 20 which are opposed to each other to hold the substrate 11 therebetween along the direction C.

In the manufacturing process according to the first embodiment, the separation introduction recess portions 20 are formed on the regions opposed to the groove portions 30 and the separation step is performed along the groove portions 30 and the separation introduction recess portions 20, whereby the thickness of the substrate 11 can be further reduced due to the groove portions 30 and the separation introduction recess portions 20 and hence separation of the wafer can be further easily performed along the direction C.

In the manufacturing process according to the first embodiment, the separation step includes a step of performing the separation so that the cleavage introduction steps 19a (19b) are provided on the regions on the sides (sides along arrow B) opposite to the first sides (sides along arrow A) formed with the ridge portions 12a (waveguides), whereby the GaN-based semiconductor laser chips 200 are obtained in a state where the cleavage introduction steps 19a (19b) are kept away from the regions arranged with the ridge portions 12a (waveguides) to the sides along arrow B. Consequently, bonding positions of the metal wires can be determined so as not to damage the ridge portions 12a by observing planer positions of the cleavage introduction steps 19a (19b).

Further, the cleavage introduction steps 19a (19b) can be formed on the positions separated from the ridge portions 12a (waveguides), and hence damage of the ridge portion 12a (waveguides) can be suppressed when forming the cleavage introduction steps 19a (19b) from the sides of the ridge portions 12a. Thus, deterioration of the laser characteristics can be suppressed also by this. Only sizes of the regions of the portions having the cleavage introduction steps 19a (19b) increase in the GaN-based semiconductor laser chips 200, and hence handling of the device in the manufacturing process can be easily performed.

In the manufacturing process according to the first embodiment, the step of forming the semiconductor layer 12 includes a step of forming the recessed groove portions 11a extending parallel to the first direction (direction C) on the surface of the substrate 11 and a step of crystal-growing the semiconductor layer 12 on the surface of the substrate 11 formed with the groove portions 11a, whereby the crystal growth rate of the semiconductor layer 12 deposited on the groove portions 11a and the crystal growth rate of the semiconductor layer 12 deposited on the surface of the substrate 11 other than the groove portions 11a can be controlled and hence the groove portions 30 formed by the semiconductor layer 12 and dividing the semiconductor layer 12 in the direction along arrow A (along arrow B) can be easily formed on the groove portions 11a.

In the manufacturing process according to the first embodiment, the step of crystal-growing the semiconductor layer 12 includes a step of crystal-growing the semiconductor layer 12 having a thickness smaller than the depths D3 (=about 5 μm) of the groove portions 11a, whereby difference between the crystal growth rate of the semiconductor layer 12 deposited on the groove portions 11a and the crystal growth rate of the semiconductor layer 12 deposited on the surface of the substrate 11 other than the groove portions 11a can become more remarkable and hence the groove portions 30 formed by the semiconductor layer 12 can be reliably formed on the groove portions 11a.

(First Modification of First Embodiment)

Figure 13:
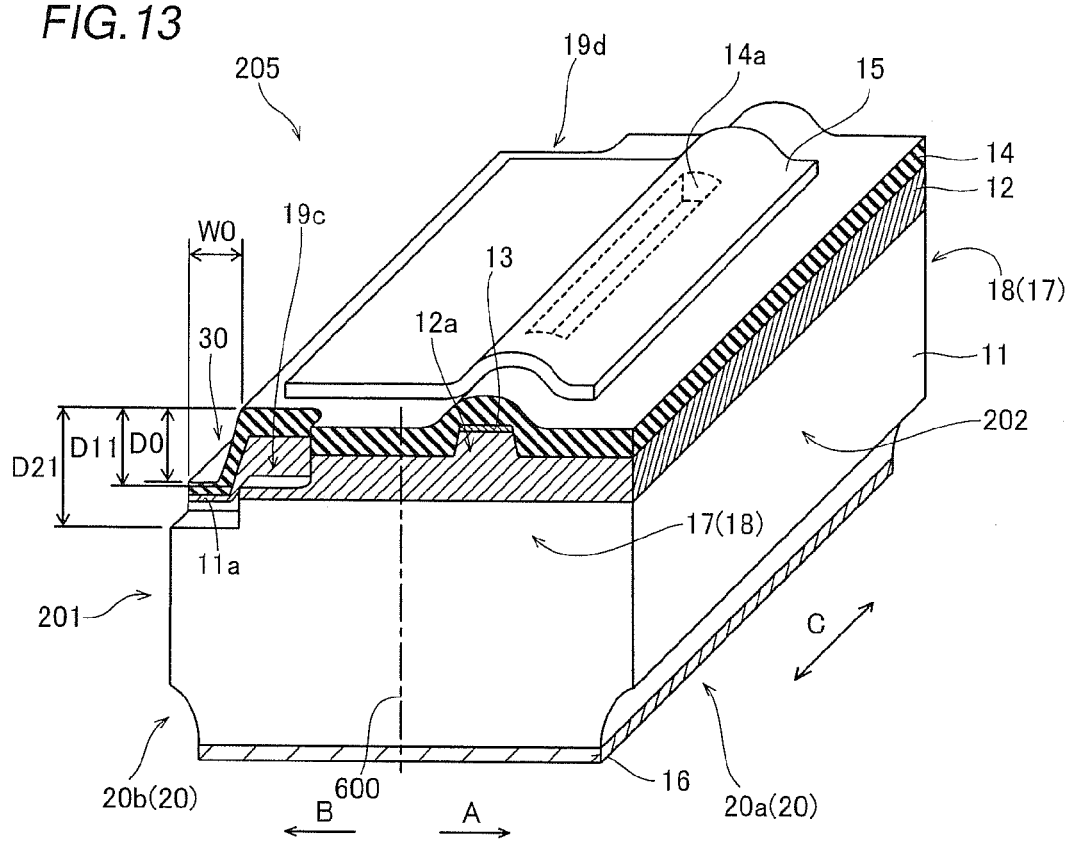
FIG. 13 is a perspective view showing the structure of a GaN-based semiconductor laser chip according to a first modification of the first embodiment of the present invention.

Referring to FIG. 13, in a GaN-based semiconductor laser chip 205 according to a first modification of the first embodiment, cleavage introduction steps 19a and 19b having depths not reaching a substrate 11 are formed on a semiconductor layer 12 dissimilarly to the aforementioned first embodiment. The cleavage introduction steps 19a and 19b are examples of the "first recess portion" in the present invention.

In the GaN-based semiconductor laser chip (device) 205 according to the first modification of the first embodiment, cleavage introduction steps 19c and 19d for performing cleavage having depths D11 (about 15 μm) are formed on boundaries between the cleavages 17 and 18 in the semiconductor layer 12 and a current blocking layer 14 from an upper surface of the GaN-based semiconductor laser chip 205, as shown in FIG. 13. In other words, in a separation process of the GaN-based semiconductor laser chip 205, the cleavage introduction steps 19c and 19d are so formed as to have bottom portions which do not reach the substrate 11 on regions where the cleavage introduction steps 19c and 19d do not intersect with a groove portion 30 and to have depths D21 (=about 20 μm) on regions where the cleavage introduction steps 19c and 19d intersect with the groove portion 30.

The remaining structure and manufacturing process of the GaN-based semiconductor laser chip 205 according to the first modification of the first embodiment are similar to those of the aforementioned first embodiment, and the effects thereof are also similar to those of the aforementioned first embodiment.

(Second Modification of First Embodiment)

Figure 14:
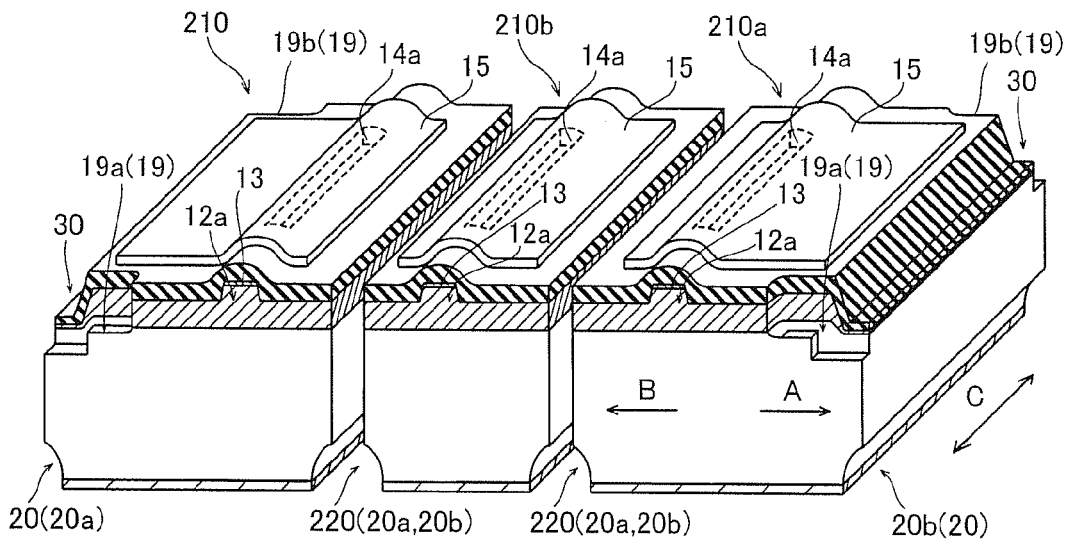
FIG. 14 is a perspective view showing the structure of a GaN-based semiconductor laser chip according to a second modification of the first embodiment of the present invention.
Figure 15:
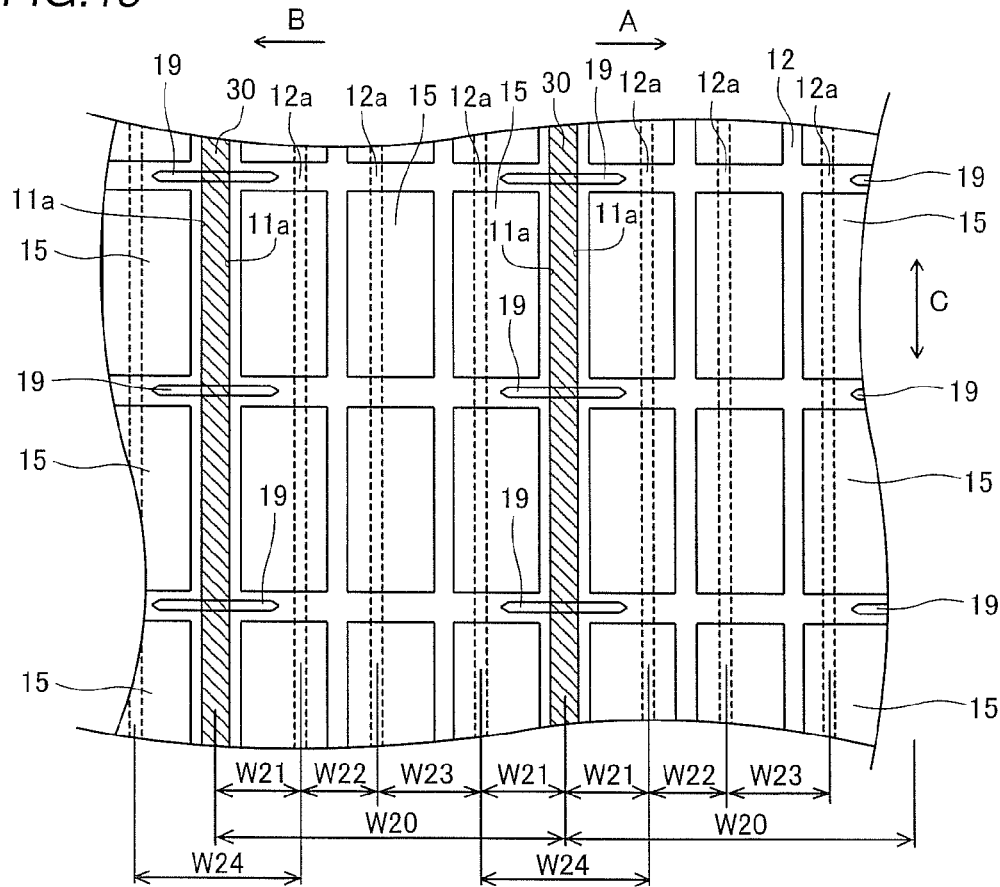
FIG. 15 is a plan view for illustrating the manufacturing process (wafer process) of the GaN-based semiconductor laser chip according to the second modification of the first embodiment shown in FIG. 14.

Referring to FIGS. 12, 14 and 15, in a GaN-based semiconductor laser device according to a second modification of the first embodiment, three GaN-based semiconductor laser chips (devices) 210, 210a and 210b are obtained between a separation introduction recess portion 20 on a position opposed to one groove portion 30 and a separation introduction recess portion 20 adjacent thereto along arrow A (along arrow B) by separation, dissimilarly to the manufacturing process of the aforementioned first embodiment.

The GaN-based semiconductor laser chip according to the second modification of the first embodiment is so formed that one GaN-based semiconductor laser chip 210b is obtained in addition to the GaN-based semiconductor laser chip 210 (210a) having a device structure similar to that of the aforementioned first embodiment, as shown in FIG. 14. A ridge portion 12a of the GaN-based semiconductor laser chip 210b is formed on a region approaching a first side (side along arrow B) from a center of the device. The semiconductor layer structure of the GaN-based semiconductor laser chip 210b is similar to that of the GaN-based semiconductor laser chip 210.

In other words, in a manufacturing process according to the second modification of the first embodiment, three ridge portions 12a extending in a striped manner in a <1-100> direction (direction C) are formed between the groove portions 30 (portions shown by slant lines) adjacent to each other in a <11-20> direction (along arrow A (along arrow B)) in a wafer process, as shown in FIG. 15. The three ridge portions 12a are formed at intervals W21, W22 and W23 in this order along arrow A and along arrow B from the center of each of the groove portions 11a (groove portions 30) which are formed on a substrate 11 at an interval W20. Therefore, the adjacent two ridge portions 12a along arrow A (along arrow B) to hold the groove portion 30 therebetween are so formed as to have a maximum interval (W24 (=W21+W21)) in the three intervals between the adjacent ridge portions 12a. The lengths of the intervals between the ridge portions 12a adjacent to each other are reduced in order of W24>W23>W22.

In a separation process after cleavage in the form of a bar, separation introduction recess portions 220 (two portions) extending in the direction C are formed between adjacent p-side pad electrodes 15 on a region of an interval W22 and between adjacent p-side pad electrodes 15 on a region of an interval W23 respectively in addition to formation of separation introduction recess portions 20 on positions opposed to the groove portions 30, and the chip-shaped GaN-based semiconductor laser chips 210a, 210b and 210 are thereafter obtained in this order through a method similar to the separation method shown in FIG. 12.

(Third Modification of First Embodiment)

Figure 16:
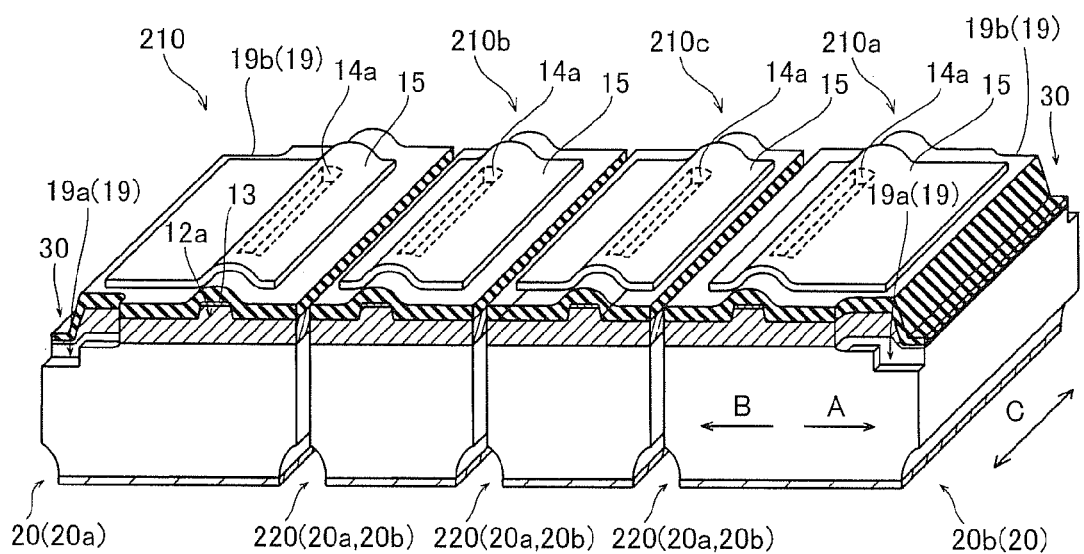
FIG. 16 is a perspective view showing the structure of a GaN-based semiconductor laser chip according to a third modification of the first embodiment of the present invention.
Figure 17:
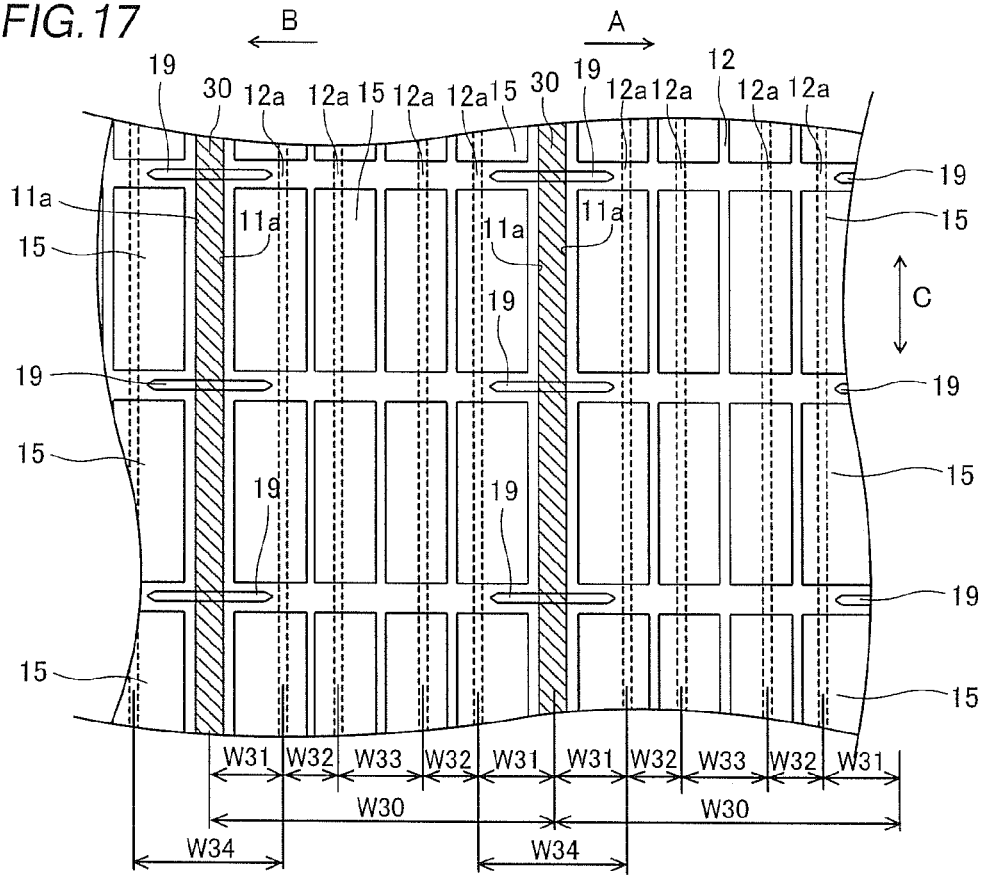
FIG. 17 is a plan view for illustrating the manufacturing process (wafer process) of the GaN-based semiconductor laser chip according to the third modification of the first embodiment shown in FIG. 16.

Referring to FIGS. 12, 16 and 17, in a GaN-based semiconductor laser chip according to a third modification of the first embodiment, four GaN-based semiconductor laser chips (devices) 210, 210a, 210b and 210c are obtained between a separation introduction recess portion 20 on a position opposed to one groove portion 30 and a separation introduction recess portion 20 adjacent thereto along arrow A (along arrow B) by separation, dissimilarly to the aforementioned second modification of the first embodiment.

The GaN-based semiconductor laser chip according to the third modification of the first embodiment is so formed that two GaN-based semiconductor laser chips 210b and 210c are obtained in addition to the GaN-based semiconductor laser chip 210 (210a) having a device structure similar to that of the aforementioned first embodiment, as shown in FIG. 16. The semiconductor layer structure of the GaN-based semiconductor laser chip 210c is similar to that of the GaN-based semiconductor laser chip 210b.

In other words, in a manufacturing process according to the third modification of the first embodiment, four ridge portions 12a extending in a striped manner in a <1-100> direction are formed between the groove portions 30 adjacent to each other in a <11-20> direction in a wafer process, as shown in FIG. 17. The four ridge portions 12a are formed at intervals W31, W32, W33 and W32 in this order along arrow A and along arrow B from the center of each of the groove portions 11a (groove portions 30) which are formed on a substrate 11 at an interval W30. Therefore, the two ridge portions 12a adjacent to each other along arrow A (along arrow B) to hold the groove portion 30 therebetween are so formed as to have a maximum interval (W34 (=W31+W31)) in the intervals between the adjacent ridge portions 12a. The lengths of the intervals between the ridge portions 12a adjacent to each other are reduced in order of W34≧W33>W32.

In a separation process after cleavage in the form of a bar, separation introduction recess portions 220 (three portions) extending in the direction C are formed between adjacent p-side pad electrodes 15 on a region of an interval W32 and between adjacent p-side pad electrodes 15 on a region of an interval W33 respectively in addition to formation of separation introduction recess portions 20 on positions opposed to the groove portions 30, and the chip-shaped GaN-based semiconductor laser chips 210a, 210c, 210b and 210 are thereafter obtained in this order through a method similar to the separation method shown in FIG. 12.

The effects of the aforementioned second and third modifications of the first embodiment are similar to those of the aforementioned first embodiment.

(Second Embodiment)

Figure 18:
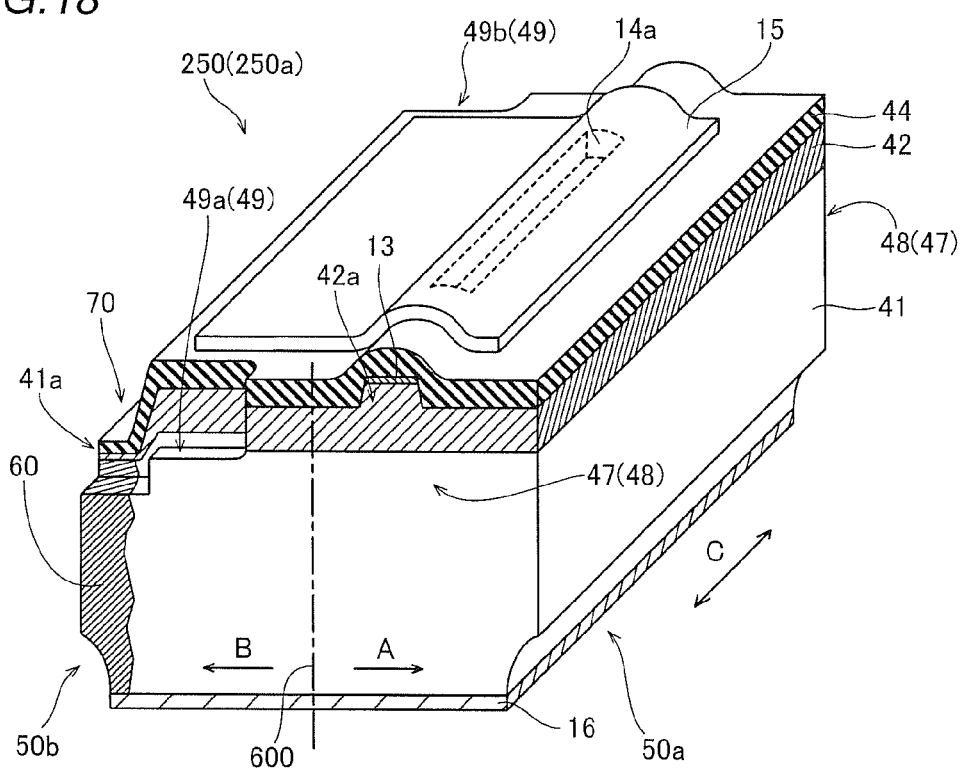
FIG. 18 is a perspective view showing the structure of the GaN-based semiconductor laser chip according to the second embodiment of the present invention.

Referring to FIG. 18, a GaN-based semiconductor laser chip 250 according to a second embodiment is formed with a substrate 41 made of n-type GaN including a region having a large number of linear crystal defects dissimilarly to the aforementioned first embodiment. The substrate 41 made of n-type GaN employed in the second embodiment is a substrate linearly concentrically forming crystal defects on a prescribed region thereby reducing the number of crystal defects in the remaining wide regions.

In the GaN-based semiconductor laser chip (device) 250 according to the second embodiment, a semiconductor layer 42 including a ridge portion 42a constituting a waveguide extending in a direction C in a striped (slender) manner is formed on a substrate 41 made of n-type GaN as shown in FIG. 18, similarly to the aforementioned first embodiment. The ridge portion 42a is an example of the "waveguide" in the present invention.

According to the second embodiment, a region 60 having a large number of crystal defects is formed in the vicinity of ends of the substrate 41 and the semiconductor layer 42 on a side along arrow B. As shown in FIG. 18, a groove portion 70 extending in a direction parallel to an extensional direction (direction C) of a ridge portion 42a is formed on the substrate 41 from the side of the semiconductor layer 42 to include the region 60. The groove portion 70 is so formed as to overlap on the groove portion 41a formed on the surface of the substrate 41 in the manufacturing process described later. The groove portion 70 is an example of the "first region" in the present invention, and the groove portion 41a is an example of the "third recess portion" in the present invention. FIG. 18 slightly exaggeratingly shows a thickness of the semiconductor layer 42 constituting the groove portion 70.

Two cleavage planes 47 and 48 constituting cavity facets of the GaN-based semiconductor laser chip 250 are formed to be orthogonal to the ridge portion 42a constituting the waveguide.

Cleavage introduction steps 49a and 49b having lengths of about 60 μm along arrow A (along arrow B) are formed on the substrate 41, the semiconductor layer 42 and a current blocking layer 44 to extend up to an end of the GaN-based semiconductor laser chip 250 on the side along arrow B, similarly to the aforementioned first embodiment. The cleavage introduction steps 49a and 49b are examples of the "first recess portion" in the present invention.

According to the second embodiment, separation introduction steps 50a and 50b for performing separation are formed on the substrate 41 and an n-side electrode 16 from the back surface of the GaN-based semiconductor laser chip 250 along an extensional direction (direction C) of the ridge portion 42a, similarly to the aforementioned first embodiment. The separation introduction steps 50a and 50b are examples of the "second recess portion" in the present invention. The remaining structure of the second embodiment is similar to that of the aforementioned first embodiment.

A manufacturing process (wafer process) in a wafer state of the GaN-based semiconductor laser chip 250 according to the second embodiment will be now described with reference to FIGS. 18 and 19.

As shown in FIG. 18, a groove portion 41a having a width (groove width) of about 40 μm and a depth of about 5 μm, extending in the direction C is formed on a main surface of the substrate 41 made of n-type GaN by etching through a process similar to the aforementioned first embodiment. At this time, the groove portion 41a is so formed as to include the region 60, having a large number of crystal defects, of the substrate 41 according to the second embodiment.

Thereafter the layers up to a p-side contact layer (not shown) are formed on the substrate 41. In this case, a region of the semiconductor layer 42 formed on the region 60, having a large number of crystal defects, of the substrate 41 also defines the region 60 having a large number of crystal defects as shown in FIG. 19, according to the second embodiment. FIG. 19 shows that the groove portion 70 (hatched region) of the semiconductor layer 42 is so formed as to include the region 60 having a large number of crystal defects.

Then, the ridge portion 42a and a p-side electrode 13 are formed through a process similar to the aforementioned first embodiment. At this time, a plurality of the ridge portions 42a are so formed as to alternately have two different intervals, i.e., prescribed intervals W9 (=about 140 μm) and W10 (=about 260 μm) as shown in FIG. 19.

Figure 19:
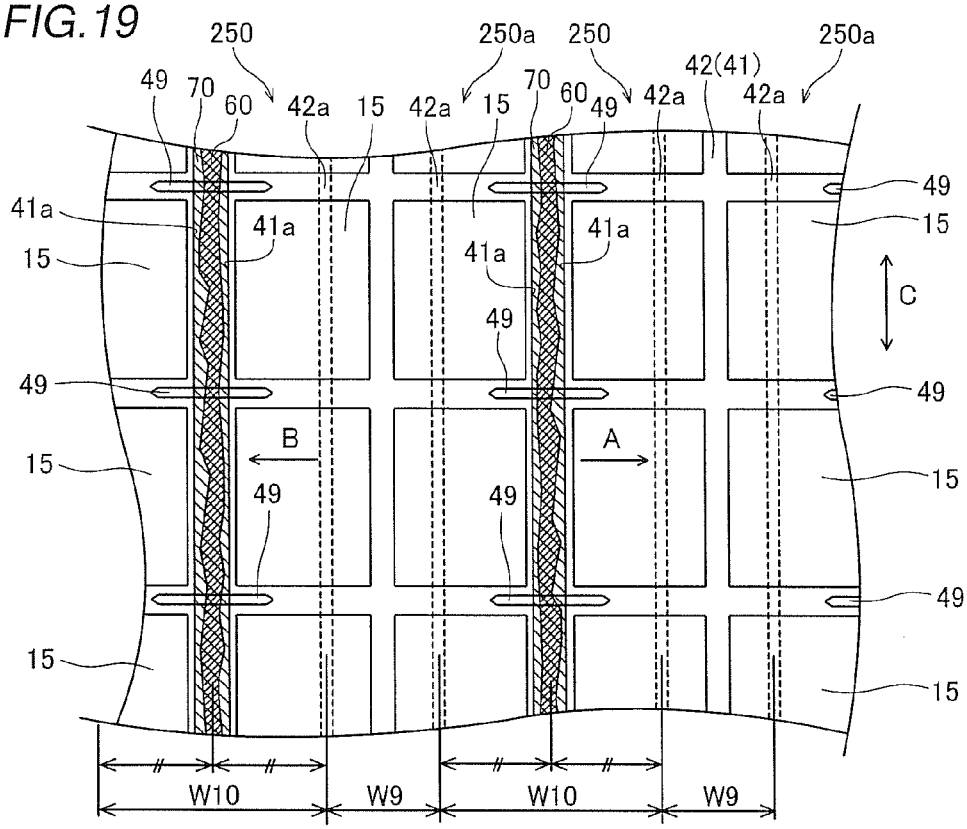
FIG. 19 is a plan view for illustrating the manufacturing process (wafer process) of the GaN-based semiconductor laser chip according to the second embodiment shown in FIG. 18.

According to the second embodiment, the ridge portions 42a (waveguides) are so formed that regions 60, having large numbers of crystal defects, of the substrate 41 and the semiconductor layer 42 are arranged on intermediate positions between the ridge portions 42a (waveguides) having the larger interval W10 (=about 260 μm) in the different two intervals, as shown in FIG. 19. The remaining manufacturing process (wafer process) in a wafer state and separation process after the wafer process according to the second embodiment are similar to the manufacturing processes of the aforementioned first embodiment. Thus, a large number of the GaN-based semiconductor laser chips 250 and 250a (see FIG. 18) having device widths of about 200 μm and lengths of about 400 μm in the direction C are manufactured.

In the manufacturing process according to the second embodiment, as hereinabove described, the plurality of ridge portions 42a are so formed that the regions 60, having large numbers of crystal defects, of the substrate 41 and the semiconductor layer 42 are located on the intermediate positions between the adjacent ridge portions 42a having the larger interval W10 (=about 260 mm) in the different two intervals W9 and W10 so that the ridge portions 42a can be formed on positions separated from the regions 60, having large numbers of crystal defects, of the substrate 41 and the semiconductor layer 42, whereby crystal defects of the substrate 41 and the semiconductor layer 42 can be inhibited from propagating to the ridge portions 42a constituting the waveguides. Thus, reduction in reliability of the GaN-based semiconductor laser chip 250 can be suppressed.

According to the second embodiment, the groove portions 70 are so formed on the upper regions of the regions 60, having large numbers of crystal defects, of the substrate 41 from the side of the semiconductor layer 42 as to extend parallel to the extensional direction C of the ridge portions 42a, and the thickness of the semiconductor layer 42 on the groove portion 70 is smaller than the thickness of the semiconductor layer 42 on the region other than the groove portion 70, whereby the groove portions 70 divide the semiconductor layer 42 in the direction (direction along arrow A (direction along arrow B)) perpendicular to the extensional direction (direction C) of the groove portions 70 with respect to the groove portions 70 employed as centers. Thus, tensile stress caused along arrow A (along arrow B) perpendicular to the direction C can be rendered smaller than tensile stress caused in the extensional direction C of the ridge portions 42a due to difference in the lattice constants between the substrate 41 (GaN) and the semiconductor layer 42 (AlGaN) in forming the semiconductor layer. Consequently, microcracks voluntarily caused between the cleavage introduction recess portions 49 adjacent to each other can be inhibited from formation while causing steps in the direction C, whereby the cleavage is excellently performed along a plurality of the cleavage introduction recess portions 49 and the smooth cleavage planes 47 and 48 (cavity facets) are obtained. Thus, damage of the ridge portion 42a constituting the waveguide can be suppressed. The remaining effects of the second embodiment are similar to the aforementioned first embodiment.

(Modification of Second Embodiment)

Figure 20:
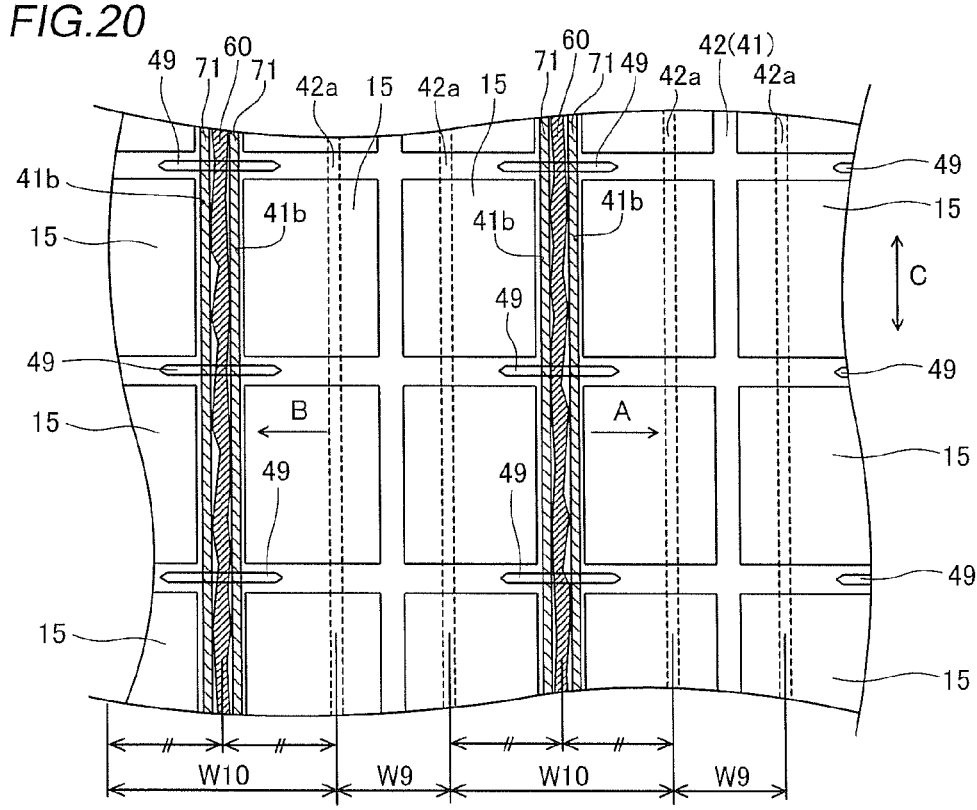
FIG. 20 is a plan view for illustrating the manufacturing process (wafer process) of a GaN-based semiconductor laser chip according to a modification of the second embodiment of the present invention.

Referring to FIG. 20, in a GaN-based semiconductor laser chip 260 (260a) according to a modification of the second embodiment, two groove portions 71 are formed on a semiconductor layer 42 to enclose both ends of a region 60, having a large number of crystal defects, of a substrate 41, dissimilarly to the aforementioned second embodiment.

In a manufacturing process of the GaN-based semiconductor laser chip (device) 260 (260a) according to the modification of the second embodiment, two groove portions 41b extending in a direction C are so formed on the substrate 41 as to enclose the both ends of the region 60, having a large number of crystal defects, of the substrate 41 made of n-type GaN, as shown in FIG. 20. The groove portion 41b is an example of the "third recess portion" in the present invention.

Thereafter, the layers up to a p-side contact layer (not shown) are formed on the substrate 41 similarly to the second embodiment. Thus, the two groove portions 71 are so formed on the semiconductor layer 42 as to enclose the both ends of the region 60, having a large number of crystal defects, of the substrate 41, as shown in FIG. 20. In this case, the two groove portions 71 are preferably formed so as not to protrude from ends of cleavage introduction steps 49 in a longitudinal direction (along arrow A (along arrow B)) to the ridge portion 42a. The groove portions 71 are examples of the "first region" in the present invention. The remaining structure and manufacturing process of the modification of the second embodiment are similar to those of the aforementioned second embodiment.

Also in a structure of the modification of the second embodiment, the thickness of the semiconductor layer 42 on each of the two groove portions 71 extending in the direction C (see FIG. 20) is smaller than the thickness of the semiconductor layer 42 on the region other than the groove portions 71. Thus, tensile stress in the direction along arrow A (along arrow B) perpendicular to the direction C caused in the semiconductor layer 42 can be relaxed by the groove portions 71, and hence microcracks can be inhibited from formation between the adjacent cleavage introduction steps 49 while locally causing steps. Thus, excellent cleavability is obtained and hence the smooth cleavage planes 47 and 48 (cavity facets) can be formed. The remaining effects of the modification of the second embodiment are similar to those of the aforementioned second embodiment.

(Third Embodiment)

Figure 21:
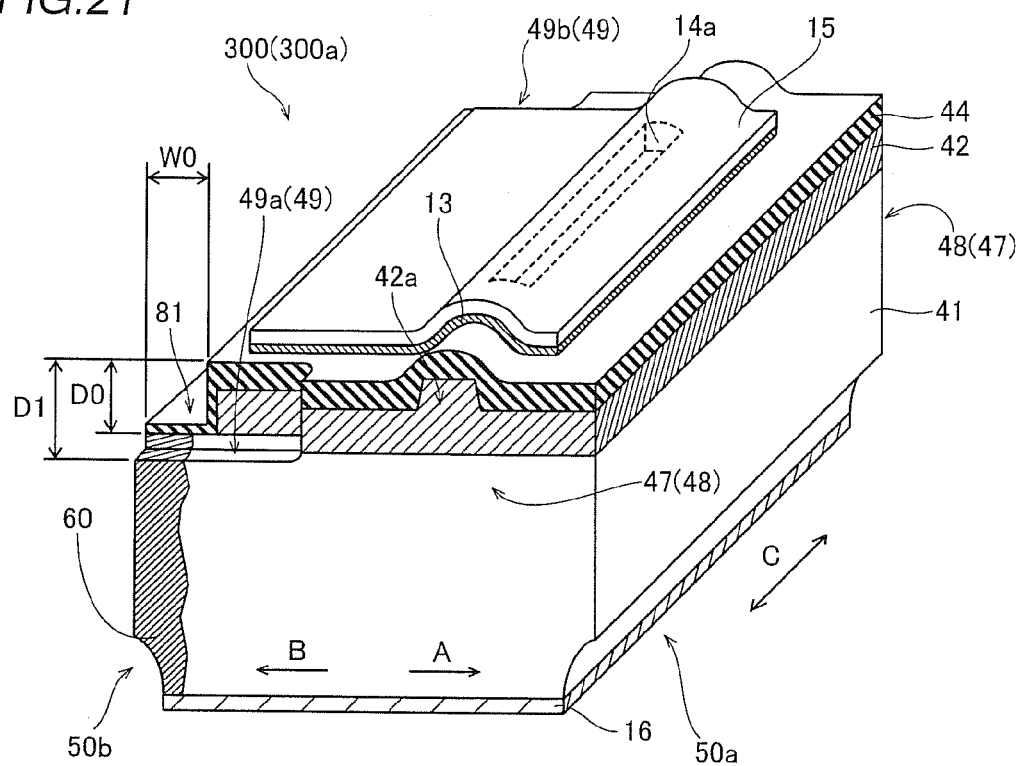
FIG. 21 is a perspective view showing the structure of a GaN-based semiconductor laser chip according to a third embodiment of the present invention.
Figure 22:
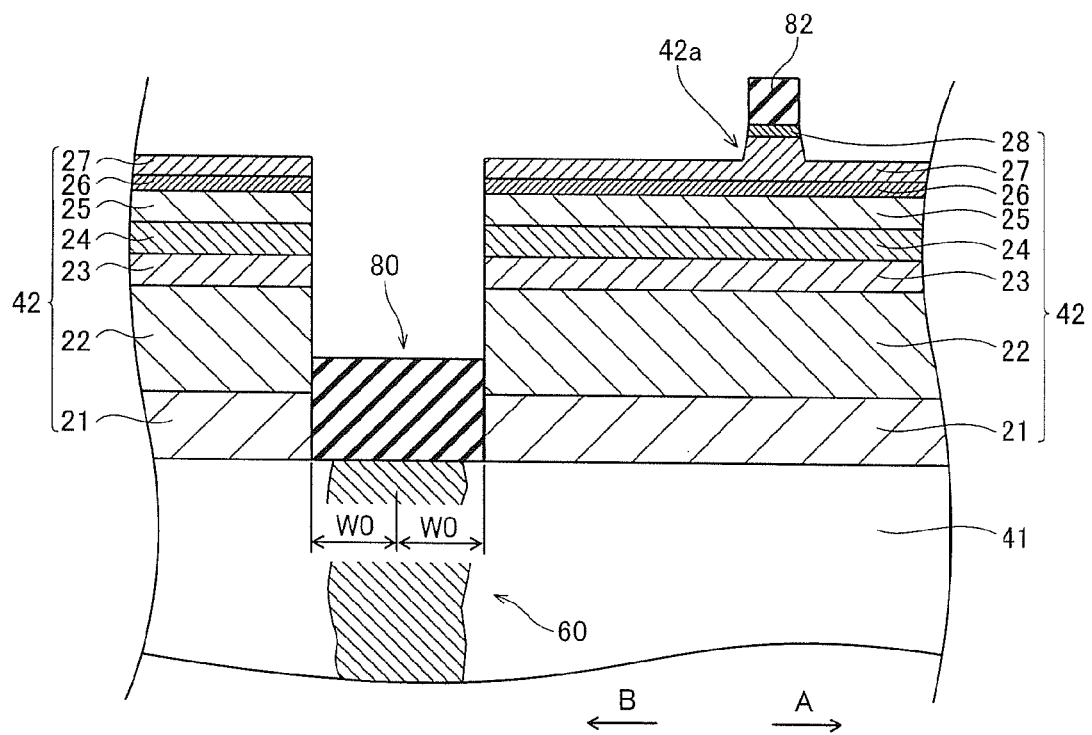
FIGS. 22 and 23 are a sectional view for illustrating the manufacturing process (wafer process) of the GaN-based semiconductor laser chip according to the third embodiment shown in FIG. 21.
Figure 23:
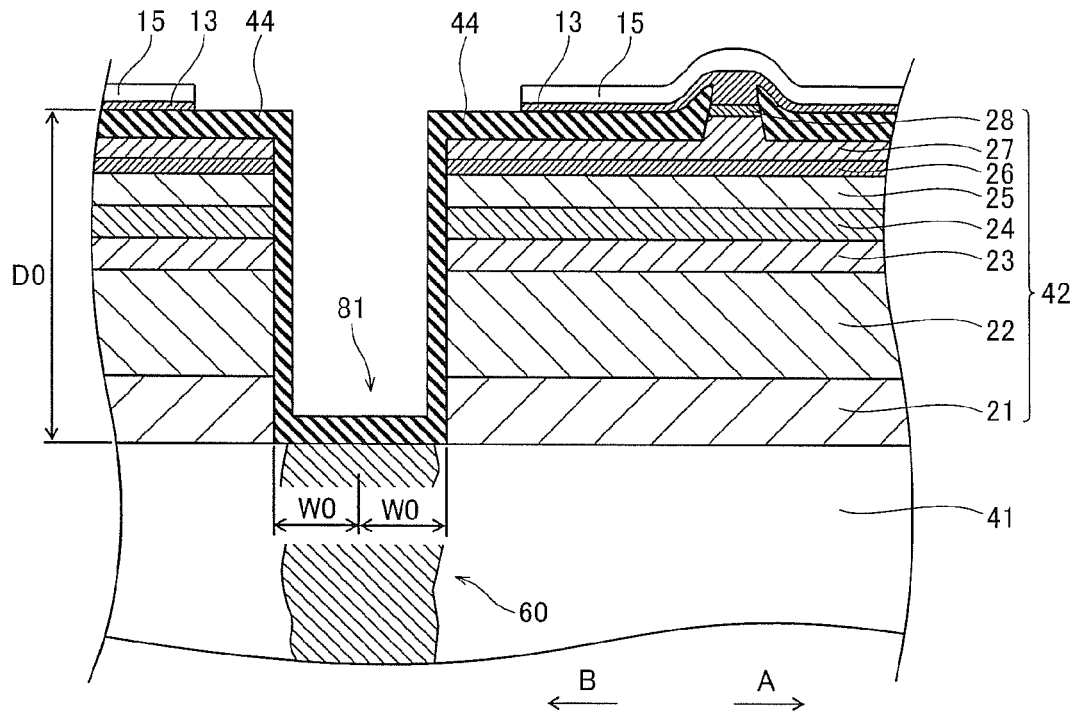

Referring to FIGS. 21 to 23, in a GaN-based semiconductor laser chip 300 (300a) according to a third embodiment, a selective growth stripe mask 80 made of SiO$_2$ having an action blocking crystal growth is formed on a substrate 41 made of n-type GaN before crystal-growing a semiconductor layer 42, thereby forming a groove portion 81 on a semiconductor layer 42, dissimilarly to the aforementioned second embodiment.

In the GaN-based semiconductor laser chip (device) 300 (300a) according to the third embodiment, the semiconductor layer 42 including a ridge portion 42a constituting a waveguide extending in a direction C in a striped (slender) manner is formed on the substrate 41 as shown FIG. 21, dissimilarly to the aforementioned second embodiment.

According to the third embodiment, the groove portion 81 extending in a direction parallel to an extensional direction (direction C) of the ridge portion 42a is formed on the substrate 41 by side surfaces of the semiconductor layer 42 and an upper surface of the substrate 41. The groove portion 81 is so formed as to have a width W0 (=about 10 μm) along arrow A from a facet of the GaN-based semiconductor laser chip 300 on the side along arrow B and to have a depth D0 (=about 5 μm) from an upper surface of the GaN-based semiconductor laser chip 300 to the substrate 41. The groove portion 81 is an example of the "first region" in the present invention. No groove is formed on the surface of the substrate 41 opposed to the groove 81 dissimilarly to the second embodiment.

According to the third embodiment, a p-side electrode 13 and a p-side pad electrode 15 are so formed as to cover a prescribed region on an upper surface of the current blocking layer 44 made of SiO$_2$. The remaining structure of the third embodiment is similar to that of the aforementioned second embodiment.

In a manufacturing process of the GaN-based semiconductor laser chip 300 according to the third embodiment, the selective growth stripe mask 80 made of SiO$_2$ having the action blocking crystal growth is formed on the flat substrate 41 in the extensional direction (direction C in FIG. 21) of the ridge portion 42a with a prescribed thickness, as shown in FIG. 22. At this time, the selective growth stripe mask 80 is so formed as to cover an upper surface of a region 60, having a large number of crystal defects, of the substrate 41.

Thereafter the semiconductor layer 42 is formed by successively stacking a buffer layer 21 and an n-type cladding layer 22 as shown in FIG. 22. At this time, an SiO$_2$ mask 82 for forming a ridge portion is so formed on a prescribed region of a p-side contact layer 28 as to extend in the direction C (see FIG. 21) after the p-side contact layer 28 is formed on a p-type cladding layer 27. Then, etching is employed for etching the p-side contact layer 28 and a prescribed region from the upper surface of the p-type cladding layer 27 through the SiO$_2$ mask 82 extending in the direction C. Thus, the ridge portion 42a having a width of about 1.5 μm constituting the p-side contact layer 28 and a projecting portion of the p-type cladding layer 27.

As shown in FIG. 23, the selective growth stripe mask 80 and the SiO$_2$ mask 82 are removed by wet etching with hydrofluoric acid. Thereafter the current blocking layer 44 made of SiO$_2$ having a thickness of about 300 nm is formed again to cover the substrate 41, from which the selective growth stripe mask 80 is removed, and the semiconductor layer 42, by plasma CVD. Thus, the groove portion 81 extending in the direction C (see FIG. 21) is formed between the adjacent semiconductor layer 42 along arrow A (along arrow B). Then the current blocking layer 44 on an upper portion of the ridge portion 42a is removed by etching, and the p-side electrode 13 and the p-side pad electrode 15 are successively formed to cover the upper portion of the ridge portion 42a and the prescribed region of the upper surface of the current blocking layer 44 by vacuum evaporation, as shown in FIG. 23.

Manufacturing processes of the GaN-based semiconductor laser chip 300 according to the third embodiment (the remaining wafer process other than the wafer process described above and a separation process) is similar to the manufacturing processes of the aforementioned second embodiment.

In a structure of the third embodiment, the semiconductor layer 42 is not formed on the groove portion 81 extending in the direction C (see FIG. 21) and the thickness of the semiconductor layer 42 on this groove portion 81 can be zero. Thus, the semiconductor layer 42 is completely divided in the direction (along arrow A (along arrow B)) orthogonal to the extensional direction (direction C) of the groove portion 81 with respect to the groove portion 81 employed as the center. Consequently, tensile stress in the direction along arrow A (along arrow B) perpendicular to the direction C caused in the semiconductor layer 42 can be further relaxed, and hence microcracks can be further inhibited from formation between the adjacent cleavage introduction steps 49 while locally causing steps. Thus, excellent cleavability is obtained and hence the smooth cleavage planes 47 and 48 (cavity facets) can be formed. The remaining effects of the third embodiment are similar to those of the aforementioned second embodiment.

(Fourth Embodiment)

Figure 24:
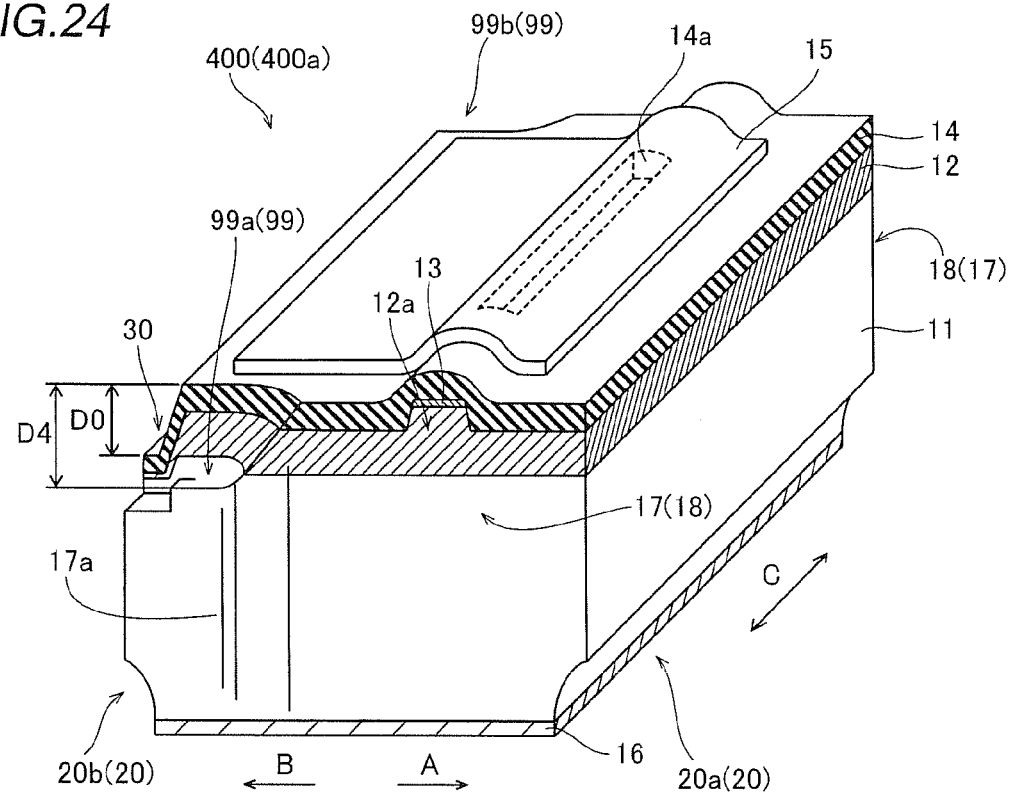
FIG. 24 is a perspective view showing the structure of a GaN-based semiconductor laser chip according to a fourth embodiment of the present invention.
Figure 25:
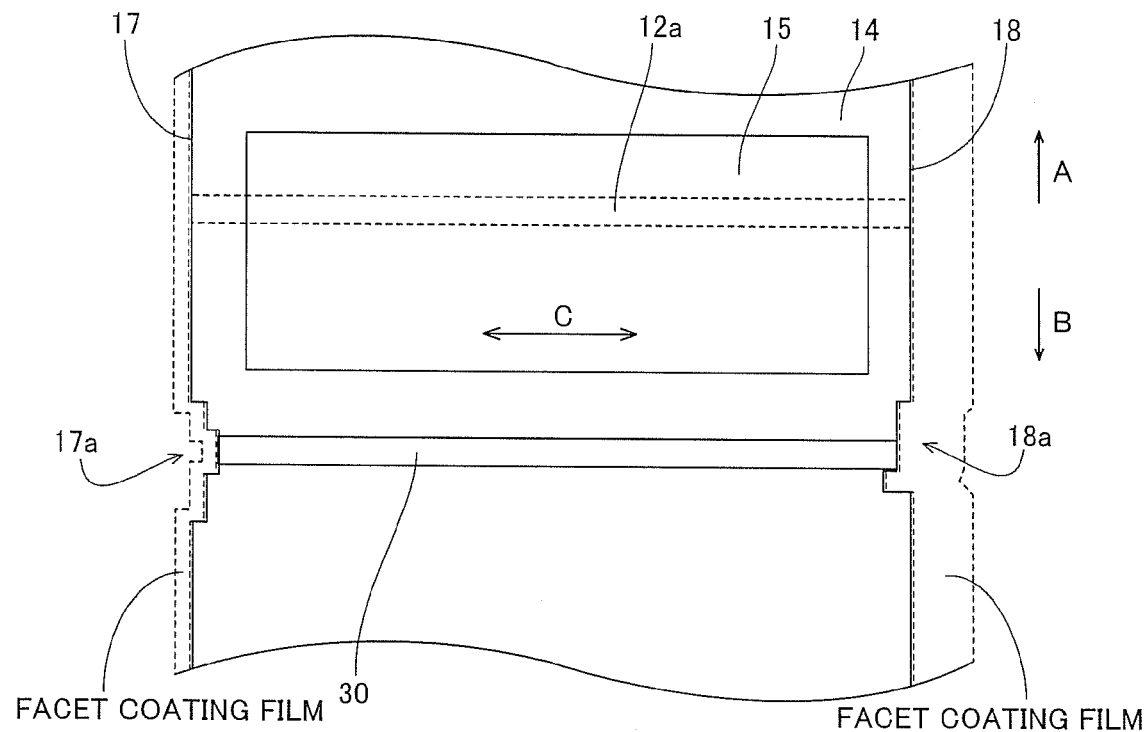
FIG. 25 is a plan view showing the structure of the GaN-based semiconductor laser chip according to the fourth embodiment shown in FIG. 24.
Figure 26:
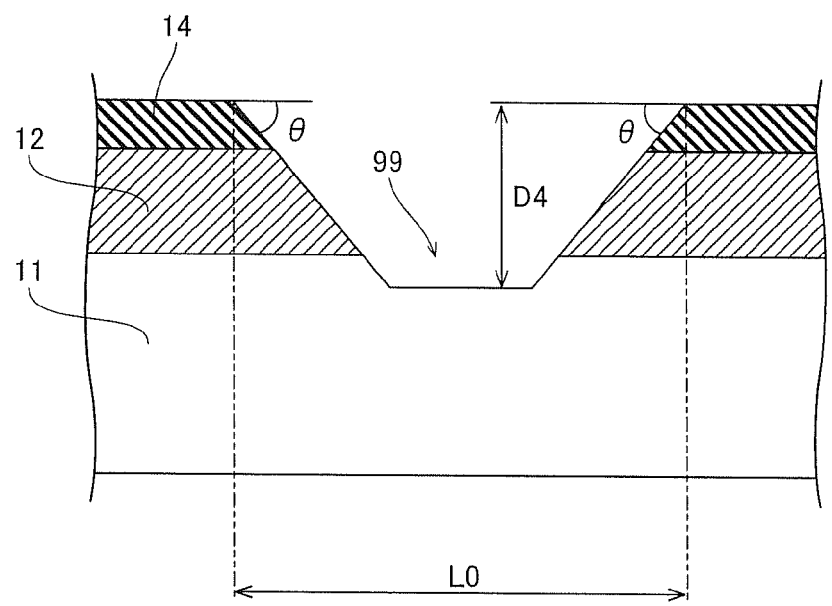
FIG. 26 is an enlarged sectional view around a cleavage introduction recess portion formed through the manufacturing process for the GaN-based semiconductor laser chip according to the fourth embodiment shown in FIG. 24.

Referring to FIGS. 24 to 26, a case of forming cleavage introduction recess portions 99 (cleavage introduction steps 99a and 99b) having trapezoidal sectional shapes as viewed from cleavage plane 17 (18) in a manufacturing process (separation process) subsequent to a wafer process for a GaN-based semiconductor laser chip (device) 400 (400a) dissimilarly to the aforementioned first embodiment will be described in a fourth embodiment.

According to the fourth embodiment, the cleavage introduction steps 99a and 99b (cleavage introduction recess portions 99) having depths D4 (=about 50 μm) and having trapezoidal sectional shapes as viewed from the cleavage plane 17 (18) are formed on the upper surface of the GaN-based semiconductor laser chip 400, as shown in FIG. 24. In other words, the cleavage introduction steps 99a and 99b are so formed that inner side surfaces are directed toward an obliquely downward direction from the side of the semiconductor layer 12, and so formed as to have planar bottom portions on positions (depth) reaching a substrate 91 made of n-type GaN, as shown in FIG. 24. The cleavage introduction recess portions 99 and the cleavage introduction steps 99a and 99b are examples of the "first recess portion" in the present invention.

As shown in FIG. 25, steps 17a and 18a are formed on partial regions of the cleavage planes 17 and 18 including the cleavage introduction steps 99a and 99b in the extensional direction (direction C) of the ridge portion 12a. In other words, the cleavage introduction steps 99a and 99b may be formed also in an extensional direction (direction C) of the ridge portion 12a in plan view (as viewed from the side of the upper surface of the GaN-based semiconductor laser chip 400), in shapes having steps 17a and 18a on parts of the cleavage planes 17 and 18.

The remaining structure of the fourth embodiment is similar to the aforementioned first embodiment. Manufacturing processes (a wafer process and a separation process) for the GaN-based semiconductor laser chip 400 according to the fourth embodiment are similar to the manufacturing processes of the aforementioned first embodiment.

According to the fourth embodiment, as hereinabove described, the cleavage introduction recess portion 99 (see FIG. 26) having a trapezoidal shape is so formed that energy for forming an end of the cleavage introduction recess portion 99 is smaller than energy for forming the bottom portion of the cleavage introduction recess portion 99, whereby a bad influence on the ridge portion 12a (see FIG. 24) close to the end of the cleavage introduction recess portion 99 is suppressed, and deterioration of the ridge portion 12a can be suppressed. Consequently, a length L0 (see FIG. 26) of the cleavage introduction recess portion 99 in a longitudinal direction can be formed longer. The cleavage introduction recess portion 99 (see FIG. 26) is appropriately so formed that an angle θ of left and right inclined surfaces (inner side surfaces) is in the range of about 30° to about 60°, and it was possible to obtain a device having excellent laser characteristics in a case where the cleavage introduction recess portion 99 was formed with a depth D (see FIG. 26) in the range of about 20 μm to about 60 μm when the thickness of the semiconductor laser chip was in the range of about 100 μm to about 150 μm.

As shown in FIG. 25, the steps 17a and 18a are formed on parts of the cleavage planes 17 and 18, whereby separation of facet coating films can be suppressed when the facet coating films (insulating films consisting of single-layer films or multilayer films) (shown by broken lines in FIG. 25) are formed on a light emitting facet and a reflecting facet of the semiconductor laser chip in the cleaved bar-shaped device, for example. In other words, separation caused on a partial region spreads in a wide range when a thin film is formed on the light emitting facet (reflecting facet) consisting of a completely planar surface, while the thin films strongly adhere also to the steps 17a and 18a when the steps 17a and 18a are formed on parts of the cleavage planes 17 and 18 as described above, whereby separation of the facet coating films can be inhibited from propagating to adjacent semiconductor laser chips.

Further, such steps 17a and 18a are so formed that the facet coating films (shown by broken lines) can be inhibited from separation resulting from mechanical stress in bar-shaped cleavage or thermal stress in a case of operating as the semiconductor laser chip.

As to the irregularities of such steps 17a and 18a (depths of the steps in a direction C in FIG. 25), at least thicknesses substantially identical to the minimum values (about 50 nm, for example) of the thicknesses of the facet coating films are preferable in consideration of adherence to the facet coating films. On the other hand, cavity length deviation may result if the irregularities of the steps 17a and 18a are excessively large, whereby the irregularities are preferably set to not more than about 5 nm from tolerance for dispersion of the cavity length, in consideration of a case of mounting the semiconductor laser chip on an optical pickup, for example. The remaining effects of the fourth embodiment are similar to those of the aforementioned first embodiment.

(Fifth Embodiment)

Figure 27:
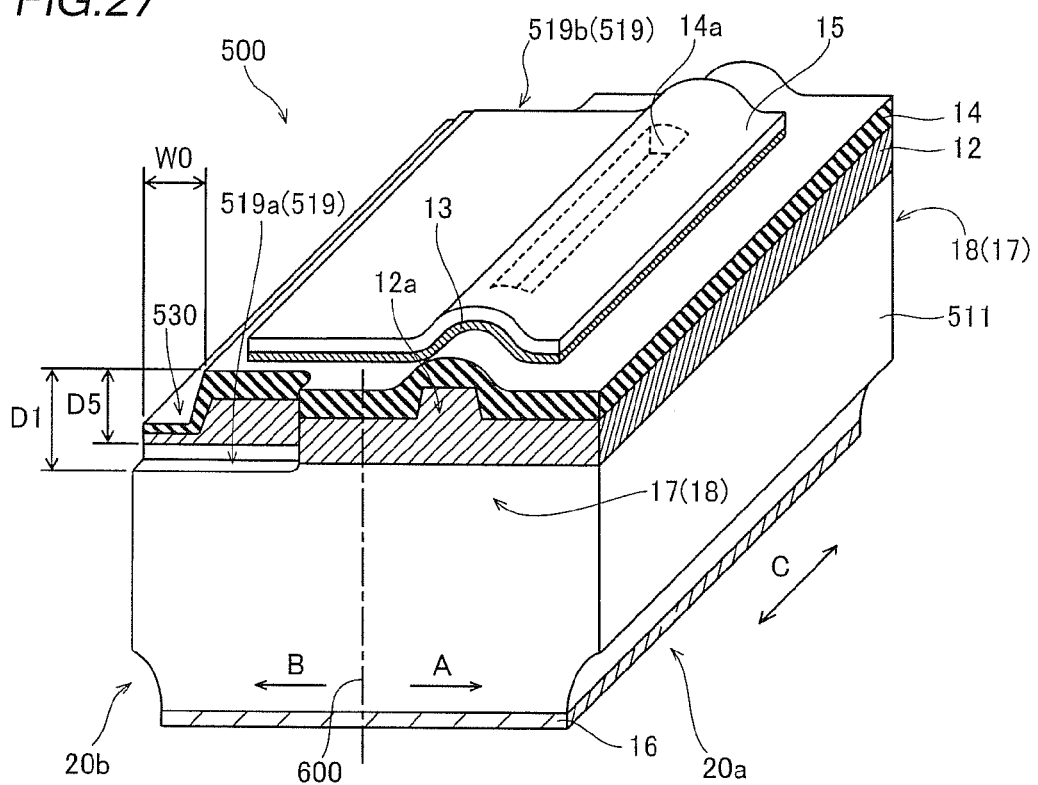
FIG. 27 is a perspective view showing the structure of a GaN-based semiconductor laser chip according to a fifth embodiment of the present invention.
Figure 28:
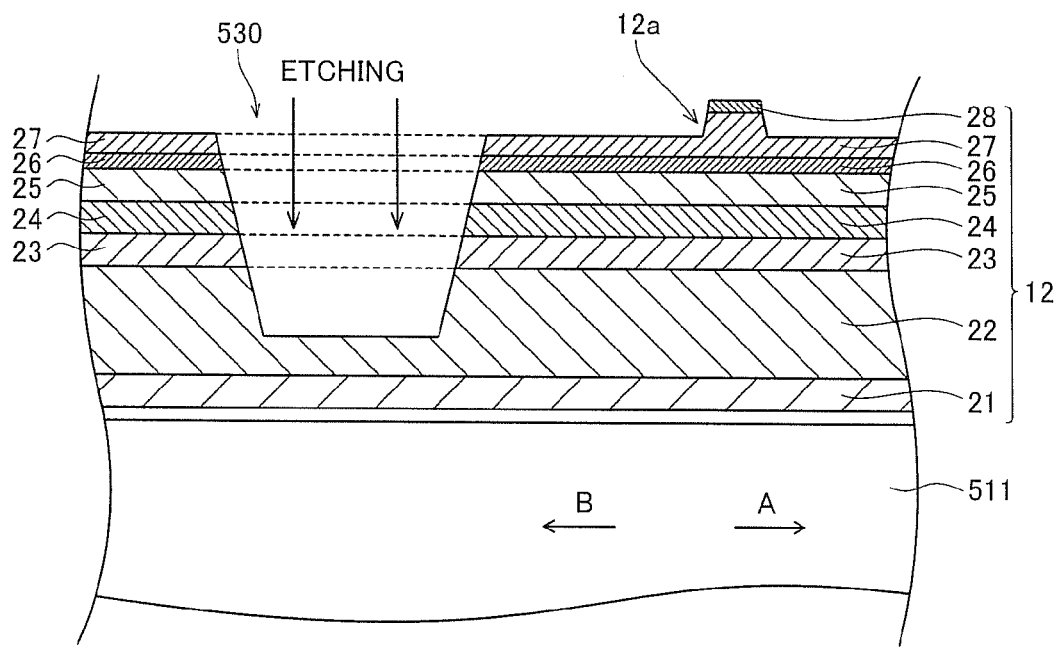
FIG. 28 is a sectional view for illustrating the manufacturing process (wafer process) of the GaN-based semiconductor laser chip according to the fifth embodiment shown in FIG. 27.
Figure 29:
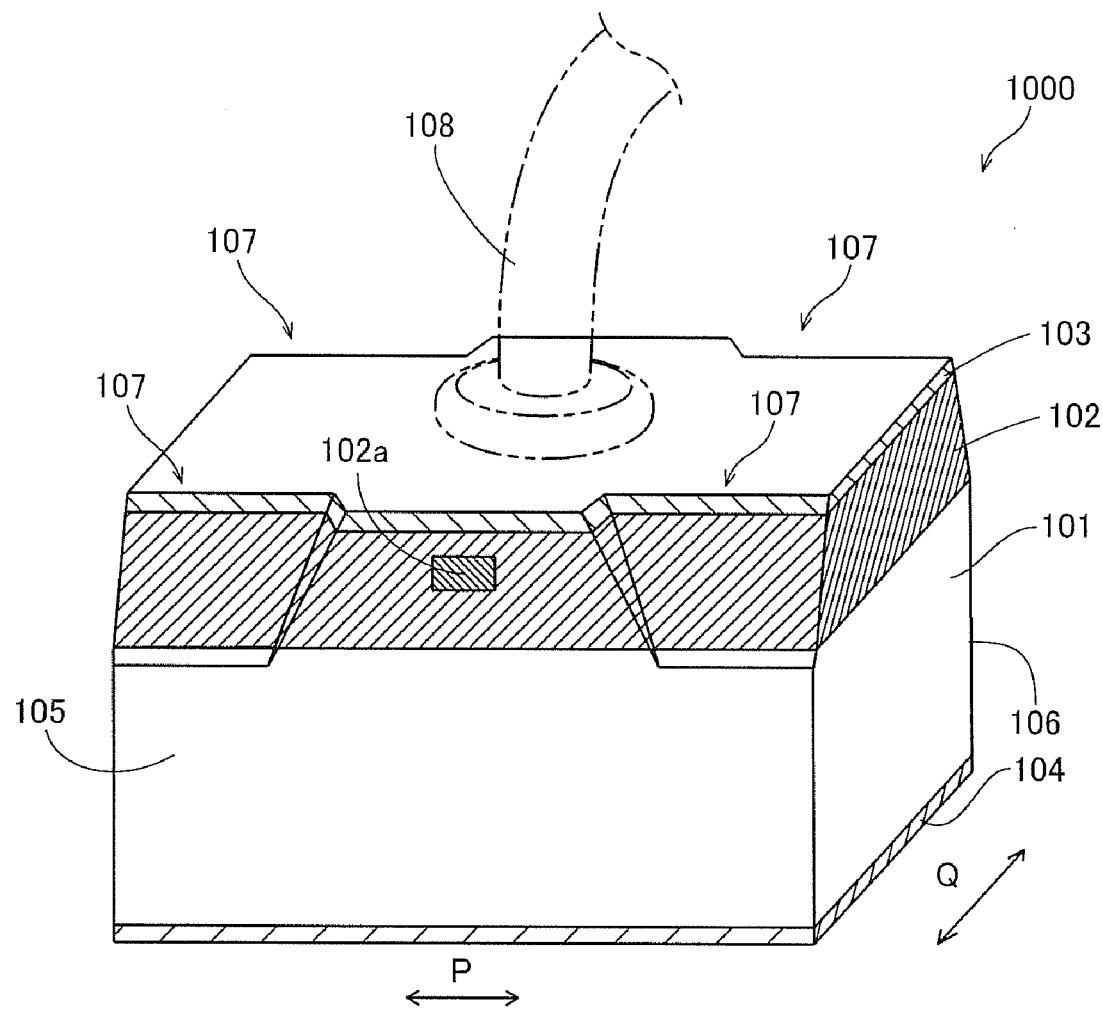
FIG. 29 is a perspective view showing the structure of a conventional nitride-based semiconductor laser device comprising a semiconductor layer provided with a striped waveguide disclosed in Japanese Patent Laying-Open No. 2003-17791.

Referring to FIGS. 27 and 28, in a GaN-based semiconductor laser chip 500 according to a fifth embodiment, a groove portion 530 having a depth not reaching a substrate 511 made of n-type GaN is formed on the semiconductor layer 12 and no groove portion is formed on a surface of the substrate 511 corresponding to the groove portion 530 dissimilarly to the aforementioned first embodiment. The groove portion 530 is an example of the "first region" in the present invention.

In the GaN-based semiconductor laser chip (device) 500 according to the fifth embodiment, the groove portion 530 extending in a direction parallel to an extensional direction (direction C) of a ridge portion 12a is formed on the semiconductor layer 12 as shown in FIG. 27. The groove portion 530 is so formed as to have a width W0 (=about 10 μm) along arrow A from an end of the GaN-based semiconductor laser chip 500 (semiconductor layer 12) on a side along arrow B and to have a depth D5 (=about 3 μm) from an upper surface of the GaN-based semiconductor laser chip 500 to the semiconductor layer 12.

In other words, in a manufacturing process of the fifth embodiment, the semiconductor layer 12 is first crystal-grown on a main surface of the planar substrate 511 in a wafer process, and layers from a p-side contact layer 28 to a part of an n-type cladding layer 22 are thereafter etched by dry etching for forming the groove portions 530, as shown in FIG. 28. Then a current blocking layer 14 (see FIG. 27) is formed to cover bottom surfaces and side surfaces of the groove portions 530.

The cleavage introduction steps 519a and 519b having lengths of about 60 μm along arrow A (along arrow B) are formed on the substrate 511, the semiconductor layer 12 and current blocking layer 14 to extend up to the end of the GaN-based semiconductor laser chip 500 on the side along arrow B similarly to the aforementioned first embodiment (see FIG. 27). The cleavage introduction steps 519a and 519b are examples of the "first recess portion" in the present invention.

The remaining structure and manufacturing process of the GaN-based semiconductor laser chip 500 according to the fifth embodiment are similar to those of the aforementioned first embodiment. The effects of the fifth embodiment are similar to those of the aforementioned first embodiment.

The embodiments and the modifications thereof disclosed this time are to be considered as illustrative in all points and not restrictive. The range of the present invention is shown not by the above description of the embodiments and the modifications thereof but by the scope of claim for patent, and all modifications within the meaning and range equivalent to the scope of claim for patent are included.

For example, while each of the aforementioned first to fifth embodiments of the present invention is applied to the GaN-based semiconductor laser chip, the present invention is not restricted to this but is also applicable to a semiconductor laser device other than a GaN-based one.

While the ridge portion (waveguide) is formed on the region approaching the first side by the distance W1 (=about 30 μm) from the center of the GaN-based semiconductor laser chip (n-type GaN substrate) in each of the first to fifth aforementioned embodiments, the present invention is not restricted to this but the ridge portion may alternatively be formed on a region approaching the first side by a length other than about 30 μm from the center of the GaN-based semiconductor laser chip. In this case, the ridge portion is preferably formed on a region approaching the first side by at least about 20 μm from the center of the GaN-based semiconductor laser chip. According to this structure, bonding of a metal wire onto the ridge portion can be suppressed also when a generally employed metal wire having a diameter of about 30 μm is bonded to the center of the GaN-based semiconductor laser chip, whereby damage of the ridge portion (waveguide) can be suppressed in bonding.

While the cleavage introduction steps are formed on the substrate, the semiconductor layer and the current blocking layer in each of the aforementioned first to fifth embodiments, the present invention is not restricted to this but the cleavage introduction steps may be formed not on the substrate but only on the semiconductor layer and the current blocking layer.

While the cleavage introduction recess portions are so formed that the centers of the cleavage introduction recess portions are arranged on the intermediate positions between the adjacent ridge portions (waveguides) in the manufacturing process (separation process) subsequent to the wafer process for the GaN-based semiconductor laser chip in each of the aforementioned first to fifth embodiment embodiments, the present invention is not restricted to this but the cleavage introduction recess portions may alternatively be so formed that the centers of the cleavage introduction recess portions are on positions other than the intermediate positions between the adjacent ridge portions (waveguides). In this case, the cleavage introduction recess portions may be formed at a prescribed interval from the ridge portions (waveguides).

While the substrate 41 made of n-type GaN linearly provided with the region 60 having a large number of crystal defects is employed in the aforementioned second embodiment, the present invention is not restricted to this but a substrate made of n-type GaN provided with a region having a large number of crystal defects in a shape, such as a network shape, for example, other than the linear shape.

While the grooves 11*a* (41*a*) are previously formed on the substrate 11 (41) before crystal growth of the semiconductor layer 12 to form the groove portions 30 (70) on the crystal grown semiconductor layer 12 (42) in the manufacturing process of each of the aforementioned first and second embodiments, the present invention is not restricted to this but groove portions (first regions) may be formed from the side of the semiconductor layer 12 after the semiconductor layer 12 is grown on the planer substrate. Also in this manufacturing process, the groove portions formed after crystal growth are preferably formed so as not to protrude from ends of the cleavage introduction recess portions in a longitudinal direction (first recess portions) to the ridge portions 12*a* (42*a*). Also in the structure of this modification, tensile stress in the direction perpendicular to the groove portion (first region) applied to the semiconductor layer 12 can be relaxed, and hence microcracks can be inhibited from formation between the adjacent cleavage introduction steps (first recess portions) while causing local steps. Thus, excellent cleavability is obtained and hence the smooth cleavage planes (cavity facets) can be formed.

While a plurality of the GaN-based semiconductor laser chips are formed to have different widths (W21, W22, W23) of the respective laser devices along arrow A (along arrow B) in the aforementioned second and third modifications of the first embodiment, the present invention is not restricted to this but a plurality of the GaN-based semiconductor laser chips may be formed so that widths of the respective laser devices along arrow A (along arrow B) are equal to each other.

While the steps 17*a* and 18*a* are formed on parts of the cleavage planes 17 and 18 in the aforementioned fourth embodiment, the present invention is not restricted to this but the aforementioned steps formed on parts of the cleavage planes may be formed on the cleavage planes of the GaN-based semiconductor laser chip according to each of the aforementioned first to third embodiments other than the aforementioned fourth embodiment.

While the three or four GaN-based semiconductor laser chips are obtained between the respective groove portions in each of the aforementioned second and third modifications of the aforementioned first embodiment, the present invention is not restricted to this but separation may be performed to obtain at least five GaN-based semiconductor laser chips.

What is claimed is:

1. A method of manufacturing a semiconductor laser device, comprising steps of:
    forming a semiconductor layer on a surface of a substrate;
    forming a plurality of first recess portions;
    performing cleavage along said plurality of first recess portions; and
    forming chips by separating said semiconductor layer along a first direction parallel to said surface, wherein
    said semiconductor layer includes a plurality of waveguides and first regions,
    said plurality of waveguides are extending in said first direction,
    said first regions are separated from said waveguides and extend in said first direction,
    each of second regions are provided between each of said waveguides and each of said first regions,
    said plurality of first recess portions are provided in an upper surface of said semiconductor layer and extend in a second direction from said first regions to said second regions,
    said second direction is parallel to said surface and intersects with said first direction,
    a thickness of said semiconductor layer on said first region is smaller than a thickness of said semiconductor layer on said second region, and
    each of said chips has said waveguide on a region approaching a first side from a center of said chip in said second direction.

2. The method of manufacturing a semiconductor laser device according to claim 1, wherein
    said thickness of said semiconductor layer on said first region is substantially zero.

3. The method of manufacturing a semiconductor laser device according to claim 1, wherein
    said step of forming said semiconductor layer includes a step of forming said plurality of waveguides having different plural intervals and said first regions located between adjacent said waveguides having the largest interval in said different plural intervals.

4. The method of manufacturing a semiconductor laser device according to claim 3, wherein
    said step of forming said semiconductor layer includes a step of forming said semiconductor layer so that third regions, having large numbers of crystal defects, of at least either said substrate or said semiconductor layer are located between adjacent said waveguides having the largest interval in said plural different intervals.

5. The method of manufacturing a semiconductor laser device according to claim 1, wherein
    said step of forming said chips is performed by separating said semiconductor layer in said first regions.

6. The method of manufacturing a semiconductor laser device according to claim 1, further comprising a step of forming second recess portions extending parallel to said first direction on a back surface of said substrate opposite to said surface of said substrate in advance of said step of forming said chips.

7. The method of manufacturing a semiconductor laser device according to claim 6, wherein
    said second recess portions are formed on fourth regions opposed to said first regions, and
    said step of forming said chips is performed by separating said semiconductor layer in said first regions and said second recess portions.

8. The method of manufacturing a semiconductor laser device according to claim 1, wherein said step of forming said chips includes a step of performing separation so that said surface of said substrate has said first recess portions on regions of sides opposite to said first sides of said waveguides.

9. The method of manufacturing a semiconductor laser device according to claim 1, wherein
said step of forming said first regions includes a step of forming third recess portions extending parallel to said first direction on said surface of said substrate and a step of crystal-growing said semiconductor layer on said surface of said substrate on which said third recess portions are formed.

10. The method of manufacturing a semiconductor laser device according to claim 9, wherein
said step of crystal-growing said semiconductor layer includes a step of crystal-growing said semiconductor layer to have a thickness smaller than depths of said third recess portions.

11. The method of manufacturing a semiconductor laser device according to claim 1, further comprising step of:
forming a first electrode layer formed on said surface, wherein
said first electrode layer is formed at a distance from said first recess portion.

12. The method of manufacturing a semiconductor laser device according to claim 1, further comprising step of:
forming a second electrode layer formed on a back surface of said substrate opposite to said surface of said substrate.

13. The method of manufacturing a semiconductor laser device according to claim 1, wherein
said substrate and said semiconductor layer are made of nitride-based semiconductors.

* * * * *